United States Patent [19]

Whetsel

[11] Patent Number: 5,687,312

[45] Date of Patent: Nov. 11, 1997

[54] METHOD AND APPARATUS FOR PROCESSOR EMULATION

[75] Inventor: Lee D. Whetsel, Plano, Tex.

[73] Assignee: Texas Instruments Incorporated, Dallas, Tex.

[21] Appl. No.: 391,291

[22] Filed: Feb. 21, 1995

Related U.S. Application Data

[63] Continuation of Ser. No. 101,503, Jul. 30, 1993, abandoned.

[51] Int. Cl.[6] .................................................. G06F 11/34
[52] U.S. Cl. ............................. 395/183.04; 371/22.3; 395/500
[58] Field of Search .................. 395/183.04, 183.05, 395/183.06, 183.01, 500, 821; 364/927.81, 232.3, 481, 579; 371/22.2, 22.3, 22.6, 21.2, 21.6

[56] References Cited

U.S. PATENT DOCUMENTS

| | | | |
|---|---|---|---|
| 4,447,876 | 5/1984 | Moore | 364/200 |
| 4,633,417 | 12/1986 | Wilburn et al. | 364/481 |
| 5,093,776 | 3/1992 | Morss et al. | 395/500 |
| 5,101,498 | 3/1992 | Ehlig et al. | 395/800 |
| 5,109,190 | 4/1992 | Sakashita et al. | 371/22.3 |
| 5,109,494 | 4/1992 | Ehlig et al. | 395/325 |
| 5,150,044 | 9/1992 | Hashizume et al. | 371/22.3 |
| 5,226,047 | 7/1993 | Catlin | 395/183.04 |
| 5,254,942 | 10/1993 | D'Souga et al. | 371/22.3 |
| 5,270,642 | 12/1993 | Parker | 371/22.3 |
| 5,278,962 | 1/1994 | Masuda et al. | 395/400 |
| 5,281,864 | 1/1994 | Hahn et al. | 307/272.2 |
| 5,325,368 | 6/1994 | James et al. | 395/575 |
| 5,329,471 | 7/1994 | Swoboda et al. | 364/578 |
| 5,574,852 | 11/1996 | Bakker et al. | 395/183.04 |

FOREIGN PATENT DOCUMENTS 91-17300  11/1991  Rep. of Korea.

OTHER PUBLICATIONS

Lee Whetsel, "An IEEE 1149.1 Based Logic/Signature Analyzer in a Chip", International Test Conference, Oct. 26–30, 1991.

Sridhar Narayanan, Charles Njinda and Melvin Breuer, "Optimal Sequencing of Scan Registers", IEEE, 1992, International Test Conference 1992, paper 15.2, pp. 293–302.

*Primary Examiner*—Robert W. Beausoliel, Jr.
*Assistant Examiner*—Albert Décady
*Attorney, Agent, or Firm*—Scott B. Stahl; Leo N. Heiting; Richard L. Donaldson

[57] ABSTRACT

An emulator for emulating operations of data processing circuitry normally connected to and cooperable with a peripheral circuit includes serial scanning circuitry connectable to the peripheral circuit in substitution for the data processing circuitry. The serial scanning circuitry provides to and receives from the peripheral circuit signals which would normally be provided and received by the data processing circuitry. The serial scanning circuitry is connectable to an emulation controller for permitting serial data transfer between the emulation controller and the emulator. The emulator further includes control circuitry connected to the serial scanning circuitry and connectable to the emulation controller. The control circuitry permits the serial scanning circuitry to provide and receive the aforementioned signals while serial data is being transferred in a continuous serial data stream between the emulation controller and the serial scanning circuitry.

20 Claims, 19 Drawing Sheets

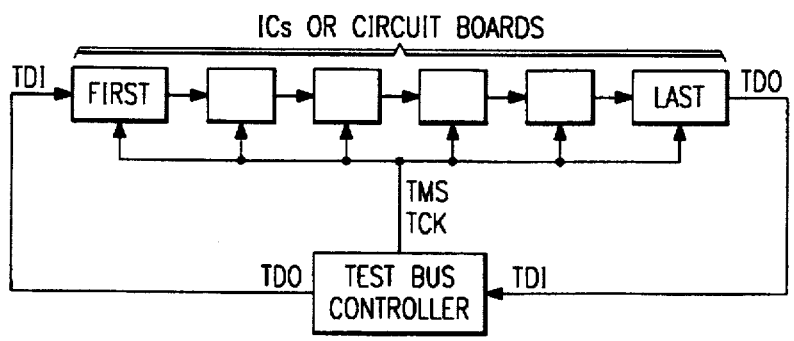
FIG. 3
(PRIOR ART)
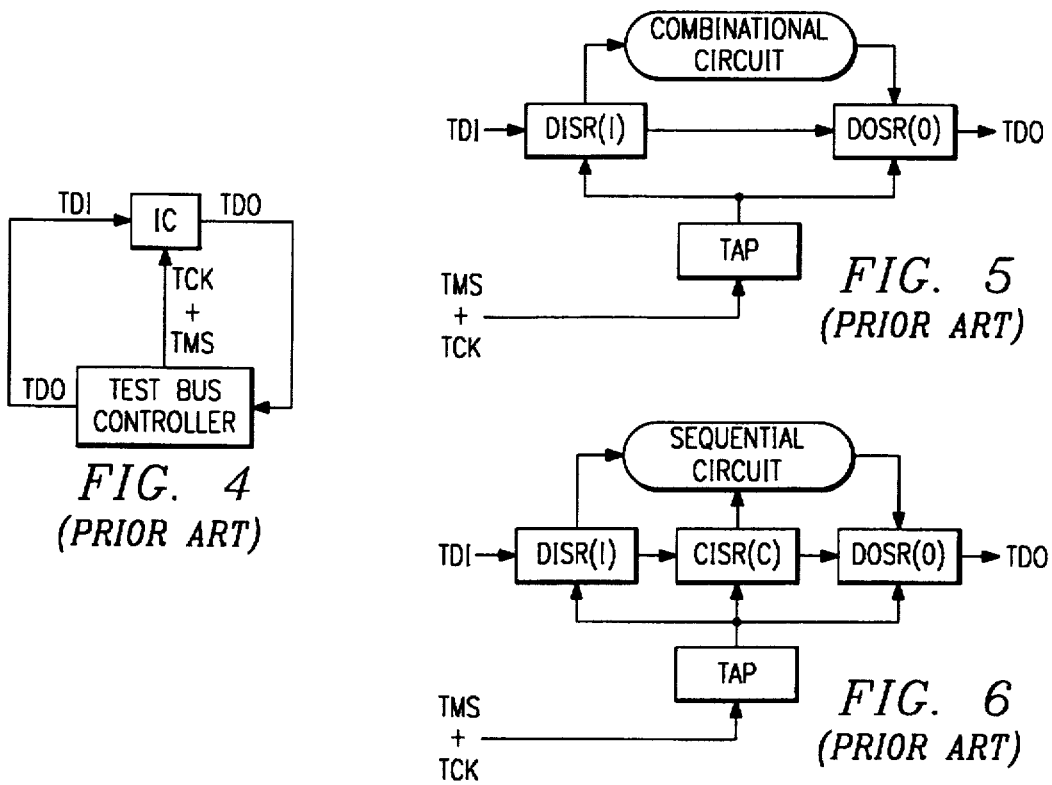
FIG. 4
(PRIOR ART)
FIG. 5
(PRIOR ART)
FIG. 6
(PRIOR ART)
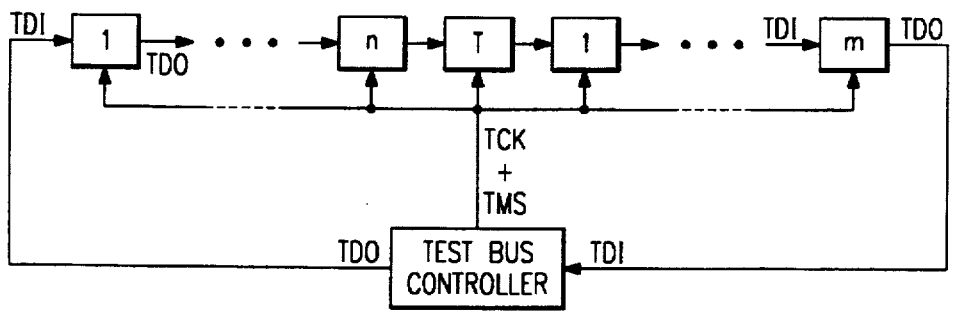
FIG. 7
(PRIOR ART)

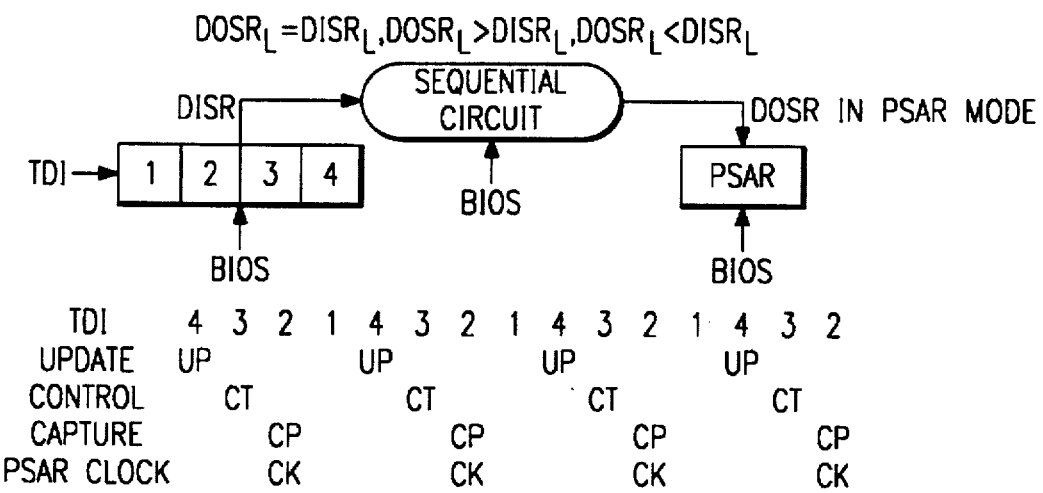
FIG. 11d
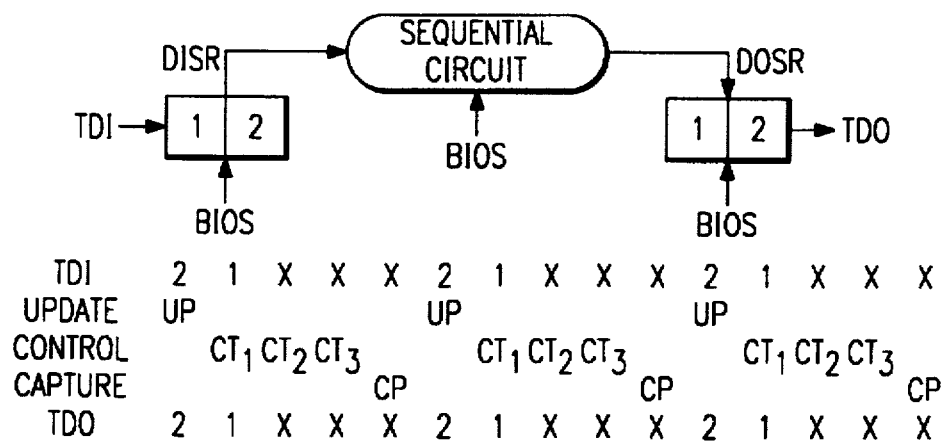
FIG. 11e
| TDI | 2 | 1 | X | X | 2 | 1 | X | X | 2 | 1 | X | X |
|---|---|---|---|---|---|---|---|---|---|---|---|---|
| UPDATE | UP | | | | UP | | | | UP | | | |
| CONTROL | | $CT_1$ | $CT_2$ | $CT_3$ | | $CT_1$ | $CT_2$ | $CT_3$ | | $CT_1$ | $CT_2$ | $CT_3$ |
| CAPTURE | CP | | | | | | CP | | | | CP | |
| TDO | X | 2 | 1 | X | X | 2 | 1 | X | X | 2 | 1 | X |
FIG. 11f

METHOD AND APPARATUS FOR PROCESSOR EMULATION

This application is a Continuation of application Ser. No. 08/101,503, filed Jul. 30, 1993, now abandoned.

CROSS REFERENCE TO RELATED DOCUMENTS

The following documents include subject matter which is related to the subject matter of this application. These documents have been assigned to the assignee of this application, and are incorporated herein by reference:

| Docket No. | PTO Reference | Effective Filing Date |
|---|---|---|
| TI-14141A | U.S. Ser. No. 07/846,459 | 07/31/89 |
| TI-14146B | U.S. Pat No. 5,329,471 | 07/31/89 |
| TI-14421 | U.S. Pat. No. 5,054,024 | 08/09/89 |
| TI-14996B | U.S. Ser. No. 08/193,616 | 03/30/90 |
| TI-16112 | U.S. Ser. No. 08/193,616 | 06/28/91 |
| TI-16400 | U.S. Ser. No. 08/089,982 | concurrent herewith |
| TI-16401 | U.S. Ser. No. 08/268,868 | concurrent herewith |
| TI-16402 | U.S. Ser. No. 08/101,504 | concurrent herewith |

FIELD OF THE INVENTION

The present invention relates generally to testing electrical circuits via serial scan access and, more particularly, to testing techniques which allow circuits to be serially tested in a more efficient manner than achieved using conventional serial test approaches.

BACKGROUND OF THE INVENTION

Test bus interfaces exist which allow serial data to be shifted in and out of integrated circuits to facilitate testing of the logic in the device. These buses are designed primarily to transfer a single pattern of serial data into and out of a selected scan path surrounding the circuit under test once per shift operation. Depending on the complexity of the circuit, potentially thousands or hundreds of thousands of shift operations may be required to fully test the circuit. Having to repeat a shift operation multiple times to transfer test data patterns into and out of the circuit being tested is time consuming.

IEEE 1149.1 Test Bus and Architecture Description

While many types of test buses exist, the IEEE 1149.1 test bus will be used in this disclosure to describe the advantages of the invention. The IEEE standard IC test bus and architecture described in the 1149.1 specification is shown in FIG. 1. This architecture has been developed to provide a standard method to serially access serial test registers in IC designs to facilitate testing. This test architecture, shown in FIG. 1, consists of an instruction register (IREG), a set of data registers (DREG) referred to as Bypass, DREG1, and DREG2, and a test interface referred to as a Test Access Port (TAP). While only one IREG may be implemented in the architecture, any number of DREGs can be included. Each DREG of FIG. 1 is associated with the input and output boundary of a circuit in the IC to enable serial testing of the circuit. The Bypass DREG is not used for testing, but rather for providing an abbreviated scan path through the IC when testing of circuits, associated with DREG1 and DREG2, is not required.

The IREG and DREGs exist on separate scan paths arranged in parallel between the test data input pin (TDI) 102 and test data output pin (TDO) 116. During IREG scan operations the TAP receives external control via the test mode select (TMS) 104 and test clock (TCK) 106 and outputs internal control via the control bus 108 to shift data through the IREG from the TDI input to the TDO output. Similarly, DREG scan operations are accomplished by the TAP receiving external control on the TMS and TCK input and outputting internal control on control bus 108 to shift data through the selected DREGs. Control for selecting one of the DREGs comes from the instruction shifted into the IREG and is output from the IREG via control bus 110. The control output on bus 110 is input to all DREGs and selects one for shifting. Control bus 110 is also input to multiplexer 1 to couple the serial output of the selected DREG to the TDO output.

The TAP is a finite state machine which responds to a scan access protocol input via the TMS and TCK inputs. The purpose of the TAP is to respond to the input scan access protocol to shift data through either the IREG or DREG. The TAP is clocked by the TCK input and makes state transitions based on the TMS input. The TAP state diagram is shown in FIG. 2 and consists of sixteen states: test logic reset (TLRESET), run test/idle (RT/IDLE), select data register scan (SELDRS), select instruction register scan (SELIRS), capture data register (CAPTUREDR), shift data register (SHIFTDR), exit1 data register (EXITDRr), pause data register scan (PAUSEDR), exit2 data register (EXIT2DR), update data register (UPDATEDR), capture instruction register (CAPTUREIR), shift instruction register (SHIFTIR), exit1 instruction register (EXIT1IR), pause instruction register Scan (PAUSEIR), exit2 instruction register (EXIT2IR), and update instruction register (UPDATEIR).

At power up or during normal operation of the host IC, the TAP will be in the TLRESET state. In this state, the TAP issues a reset signal that places all test logic in a condition that will not impede normal operation of the host IC. When test access is required, a protocol is applied via the TMS and TCK inputs, causing the TAP to exit the TLRESET state and enter the RT/IDLE state. In FIG. 2, the TMS input that causes movements between the TAP states is indicated by a logic 0 or 1. TCK is the clock that causes the TAP state controller to transition from state to state.

From the RT/IDLE state, an instruction register scan protocol can be issued to transition the TAP through the SELDRS and SELIRS states to enter the CAPTUREIR state. The CAPTUREIR state is used to preload the IREG with status data to be shifted out of the TDO output pin. From the CAPTUREIR state, the TAP transitions to either the SHIFTIR or EXIT1IR state. Normally the SHIFTIR will follow the CAPTUREIR state so that the preloaded data can be shifted out of the IREG for inspection via the TDO output while new data is shifted into the IREG via the TDI input. Following the SHIFTIR state, the TAP either returns to the RT/IDLE state via the EXIT1IR and UPDATEIR states or enters the PAUSEIR state via EXIT1IR. The reason for entering the PAUSEIR state would be to temporarily suspend the shifting of data through the IREG. From the PAUSEIR state, shifting can be resumed by re-entering the SHIFTIR state via the EXIT2IR state or it can be terminated by entering the RT/IDLE state via the EXIT2IR and UPDATEIR states.

From the RT/IDLE state, a data register scan protocol can be issued to transition the TAP through the SELDRS state to enter the CAPTUREDR state. The CAPTUREDR state is used to preload the selected DREG with data to be shifted out of the TDO output pin. From the CAPTUREDR state, the TAP transitions to either the SHIFTDR or EXIT1DR state. Normally the SHIFTDR will follow the CAP- TUREDR state so that the preloaded data can be shifted out of the DREG for inspection via the TDO output while new data is shifted into the DREG via the TDI input. Following the SHIFTDR state, the TAP either returns to the RT/IDLE state via the EXIT1DR and UPDATEDR states or enters the PAUSEDR state via EXIT1DR. The reason for entering the PAUSEDR state would be to temporarily suspend the shifting of data through the DREG. From the PAUSEDR state, shifting can be resumed by re-entering the SHIFTDR state via the EXIT2DR state or it can be terminated by entering the RT/IDLE state via the EXIT2DR and UPDATEDR states.

In application, any number of ICs that implement the IEEE 1149.1 architecture can be serially connected together at the circuit board level as shown in FIG. 3. Similarly, any number of circuit boards can be connected together to further increase the number of ICs serially connected together. The ICs in FIG. 3 are connected serially via their TDI input and TDO output pins from the first to the last IC. Also each IC receives TMS and TCK control inputs from a test bus controller. The test bus controller also outputs serial data to the TDI input of the first IC in the serial path and receives serial data from the TDO of the last IC in the serial path. The test bus controller can issue control on the TMS and TCK signals to cause all the ICs to operate together to shift data through either their internal IREG or DREGs, according to the TAP protocol procedure previously described.

During IREG shift operations the total length of the shift path is equal to the sum of the bits in each ICs IREG. For example, if one hundred ICs are in the serial path (FIG. 3) and each ICs IREG is 8 bits long, the number of bits that must be shifted per IREG shift operation is eight hundred. Similarly, during DREG shift operations the total length of the serial path is equal to the sum of the bits in each ICs selected DREG. If the Bypass DREG is selected in each IC the total number of bits shifted during a DREG scan is equal to the number of ICs times 1 bit, since the Bypass DREG is only one bit long. Each IC can select a different DREG by loading in different instructions into the IREG. For instance the first IC could be selecting a DREG with many bits while all other select their Bypass DREG. Typically when no testing is being performed in an IC its Bypass DREG is selected to reduce the ICs DREG bit length to a single bit.

The following example describes how a combinational circuit associated with an IC's DREG can be tested using 1149.1 TAP data register scan operations in a single IC test environment consisting of an IC to be tested and connections to a test bus controller (FIG. 4). This type of testing would be done by the IC vendor to verify the IC. The IC contains a DREG that is coupled to the boundary of a combinational circuit to allow the test bus controller to input and output test patterns to the circuit via the serial test bus.

FIG. 5 shows a detailed view of DREG1 of the target IC of FIG. 4 coupled to the input and output boundary of a combinational circuit. The combinational circuit could be a subcircuit within an IC or an entire IC. A combinational circuit consists of boolean logic functions with no memory or register storage. Examples of combinational circuits include but are not limited too; boolean logic blocks, address decoders, programmable logic arrays, comparators, multiplexers, and arithmetic logic units. The output response of a combinational circuit is a function of only the input stimulus. DREG1 is shown having two parts, a data input shift register (DISR) and a data output shift register (DOSR).

The DISR consists of a series of scan cells (I) and receives serial test data input from TDI and control input from the TAP. The DISR outputs serial data to the DOSR and parallel data to the combinational circuit inputs. The DOSR consists of a series of scan cells (O) and receives serial test data input from the DISR and parallel input from the combinational circuit. The DOSR outputs serial data to the TDO output. The TAP receives control input from the test bus controller via the TMS and TCK inputs and outputs control to the DISR and DOSR. The combinational circuit receives parallel test data from the DISR and outputs parallel data to the DOSR.

The DISR and DOSR may either be dedicated test logic or functional logic associated with the combinational circuit that is modifiable during test to operate as test logic. During test the scan cells of the DISR respond to control input from the TAP to input and output serial data and to output parallel data to the combinational circuit. When the TAP is inputting control to shift data through the DISR, the parallel outputs are held at the previous parallel output state. When the shift operation is complete the TAP inputs control to allow the parallel outputs to be updated with the new parallel output state that has been shifted into the DISR. Also during test, the scan cells of the DOSR respond to control input from the TAP to capture the parallel data output from the combinational circuit and then shift the captured data out the serial output of the DISR and IC to the test bus controller via the TDO output.

Prior to testing, the test bus controller inputs a test command into the IC's instruction register that selects DREG1 and the combinational circuit for testing. In this configuration, the total scan path length seen by the test bus controller is the bits in the DISR (I) plus the bits in the DOSR (O).

After loading the test command the test bus controller inputs control to cause the TAP to execute multiple data register scan operations. The data register scan operation is described in the TAP state diagram of FIG. 2. A single data register scan operations involves transition through the following states; SELDRS to CAPTUREDR to SHIFTDR to EXIT1DR to UPDATEDR.

Each data register scan operation repeats the steps of (1) capturing parallel data from the combinational circuit into the DOSR of the IC, (2) shifting data through the DISR and DOSR of the IC to output the captured data and input new test data, and (3) updating and parallel outputting the new test data from the DISR to the combinational circuit. Steps 1 and 3 (capturing and updating) require one TCK bus cycle each. Step 2 (shifting) requires a number of TCK bus cycles equal to the number of scan cells in the DISR (I) and DOSR (O).

Equation 1 represents the number of TCK bus cycles required per data register scan operation, equation 2 represents the number of data register scan operations required to completely test the combinational circuit, and equation 3 represents the required test time. For the sake of simplifying the examples, the other intermediate states the TAP transitions through during data register scan operations are not used in the equations (i.e. SELDRS and EXIT1DR).

$$\text{\# of } TCKs/\text{scan operation} = (CaptureDR) + (ShiftDR) + (UpdateDR) \quad \text{Eq 1}$$
$$= (1) + (I + O) + (I)$$

Where: $I$ = the # of *DISR* bits $O$ = the # of *DOSR* bits $$\frac{\text{\# of Scan}}{\text{Operations}} = 2^I \text{ (}I = \text{ the \# of combinational data inputs)} \quad \text{Eq 2.}$$

$$\text{Test Time} = (\text{Eq1}) \times (\text{Eq2}) \times (1/TCKfreq) \quad \text{Eq3.}$$

To establish a test time calculation benchmark for the single IC test environment using multiple 1149.1 data register scan operations, assume that; I=16, O=16, and the TCK frequency=10 Mhz. The calculated test time to test the combinational circuit is:

$$\text{Test Time} = (1+16+16+1) \times (2^{16}) \times (1/10 \text{ Mhz}) = 222.8 \text{ ms} \quad \text{Eq3}$$

While the calculated test time benchmarks for the combinational circuit may seem like insignificant amount of time, the circuit being tested may be one of a hundred similar circuits in the IC that need to be tested via the 1149.1 TAP to completely test the IC. Testing 100 combinational circuits would take 100×222.8 ms or 22.28 seconds. This test time is extremely long for an IC manufacturing test.

The following example describes how a sequential circuit associated with an IC's DREG can be tested using 1149.1 TAP data register scan operations in a single IC test environment consisting of an IC to be tested and connections to a test bus controller (FIG. 4). This type of testing would be done by the IC vendor to verify the IC. The IC contains a DREG that is coupled to the boundary of a sequential circuit to allow the test bus controller to input and output test patterns to the circuit via the serial test bus.

FIG. 6 illustrates a detailed view of DREG1 of the target IC of FIG. 4 coupled to the input and output boundary of a sequential circuit. The sequential circuit could be a subcircuit within an IC or an entire IC. A sequential circuit includes boolean logic functions combined with memory or register storage. Examples of sequential circuits include but are not limited to: read/write memories, fifo memories, counters, state machines, microprocessors, and microcomputers. The output response of a sequential circuit is a function of input stimulus, stored internal control or states, and clock or control inputs. DREG1 is shown having three parts; a data input shift register (DISR), a control input shift register (CISR), and a data output shift register (DOSR).

The DISR consists of a series of scan cells (I) and receives serial test data input from TDI and control input from the TAP. The DISR outputs serial data to the CISR and parallel data to the sequential circuit inputs. The CISR consists of at least one scan cell (C) and receives serial test data input from the DISR and control input from the TAP. The CISR outputs serial data to the DOSR and control to the sequential circuit. The DOSR consists of a series of scan cells (O) and receives serial test data input from the CISR and parallel input from the sequential circuit. The DOSR outputs serial data to the TDO output. The TAP receives control input from a test bus controller via the TMS and TCK inputs and outputs control to the DISR, CISR, and DOSR. The sequential circuit receives parallel test data input from the DISR and control input from the CISR and outputs parallel data to the DOSR.

The DISR, CISR, and DOSR may either be dedicated test logic or functional logic associated with the sequential circuit that is modifiable during test to operate as test logic. During test the scan cells of the DISR and CISR respond to control input from the TAP to input serial data from the TDI input pin and to output parallel data and control to the sequential circuit. When the TAP is inputting control to shift data into the DISR and CISR, their parallel outputs are held at the previous parallel output state. When the shift operation is complete the TAP inputs control to allow the parallel outputs to be updated with the new parallel output state that has been shifted into the DISR and CISR. Also during test the scan cells of the DOSR respond to control input from the TAP to capture the parallel data output from the sequential circuit and then shift the captured data out the serial output of the DOSR and IC via TDO.

During test, the test bus controller inputs control via the TAP to execute a data register scan operation as described in the TAP state diagram of FIG. 2. Each data register scan operation repeats the steps of (1) capturing parallel data from the sequential circuit into the DOSR during the CaptureDR state, (2) shifting new test input data into the DISR and CISR and captured output test data from the DOSR during the ShiftDR state, and (3) updating and inputting the new parallel test data and control from the DISR and CISR to the sequential circuit during the UpdateDR state.

Step 1 (capturing) and step 3 (inputting) require one TCK bus cycle each. Step 2 (shifting) requires a number of TCK bus cycles equal to the number of scan cells in the DISR (I), CISR (C), and DOSR (O). For the sake of simplifying the description, the other intermediate states the TAP must transition through during data register scan operations are not included.

Testing of the sequential circuit differs from the combinational circuit in that additional data register scan operations are required to activate the CISR control input to the sequential circuit, to allow the sequential circuit to respond to the parallel data inputs from the DISR and output parallel data to the DOSR. Each activation of a control input to the sequential circuit requires one data register scan operation to enable the control input, and another data register scan operation to disable the control input. Thus each activation required by the sequential circuit requires a pair of data register scan operations. In addition, the data register scan operations to enable and disable the control input follows the data register scan that inputs the data pattern to the sequential circuit. So the total number of data register scan operations required to apply a single test pattern to a sequential circuit is equal to; an initial data register scan operation to input the data pattern, plus a pair of data register scan operations for each time a control input needs to be activated, i.e. enabled and disabled.

For example, for one control input activated twice per applied test data pattern, five data register scan operations are required. A first scan operation inputs the data pattern to the sequential circuit, a second scan operation re-enters the data pattern and enables the control input to start the first activation, a third scan operation re-enters the data pattern and disables the control input to stop the first activation, a fourth scan operation re-enters the data pattern and enables the control input to start the second activation, and a fifth scan operation re-enters the data pattern and disables the control input to stop the second activation. A sixth scan operation enters the next data pattern to start the next control activation sequence and outputs the response of the sequential circuit to the previous data pattern.

Equation 4 represents the number of TCK bus cycles required per data register scan operation, equation 5 represents the number of data register scan operations required to completely test the sequential circuit, and equation 6 represents the required test time.

$$
\begin{aligned}
\text{\# of } TCKs/\text{scan operation} &= (\text{Capture}DR) + (\text{Shift}DR) + \quad \text{Eq 4.} \\
&\quad (\text{Update}DR) \\
&= (1 + I + C + O + 1)
\end{aligned}
$$

-continued

Where: $I$ = the # of *DISR* bits $C$ = the # of *CISR* bits $O$ = the # of *DOSR* bits # of Scan Operations = $2^I \times (1 + 2K)$  Eq 5.

Where: $I$ = the # of data inputs $K$ = the # of control input activations

Test Time=(Eq4)×(Eq5)×(1/*TCK*freq)  Eq6.

To establish a test time calculation benchmark for a sequential circuit using multiple 1149.1 TAP data register scan operations, assume that; I=16, C=1, K=3, O=16, and TCK frequency=10 Mhz. The calculated test time is;

Test Time=(1+16+1+16+1)×($2^{16}$×7)×(1/10 Mhz)=1.60s  Eq6

While the calculated test time benchmarks for the sequential circuit may seem like insignificant amounts of time, the circuit being tested may be one of a hundred similar circuits in the IC that need to be tested via the 1149.1 TAP to completely test the IC. Testing 100 sequential circuits (with C=1 and K=3) would take 100×1.60s or 160 seconds. This test time is extremely long for an IC manufacturing test.

To illustrate the effect that multiple control input activations have on the 1149.1 test time of sequential circuits, Eq6 is repeated for control input activations of K=1, 2, 4, and 5 under the same test conditions listed above.

Test Time (K=1)=(2+16+1+16)×($2^{16}$×3)×
(1/10 Mhz)=688.13 ms  Eq6

Test Time (K=2)=(2+16+1+16)×($2^{16}$×5)×
(1/10 Mhz)=1.15 seconds  Eq6

Test Time (K=4)=(2+16+1+16)×($2^{16}$×9)×
(1/10 Mhz)=2.06 seconds  Eq6

Test Time (K=5)=(2+16+1+16)×($2^{16}$×11)×(1/10 Mhz)=2.52 seconds  Eq6

From the above repeated calculations of Eq6 it is seen that testing 100 sequential circuits with K=1 takes 68.81 seconds, with K=5 takes 115 seconds, with K=4 takes 206 seconds, and with K=5 takes 252 seconds. To make the situation worse, some sequential circuits such as microprocessors and micro-controllers have multiple control inputs that must be activated individually and multiple times in order for the sequential circuit to react to an input pattern, execute its internal microcode, and output a response pattern. The lengthy test times required for testing these more complex sequential circuits via 1149.1 force them to be tested by other means or not at all.

The following example describes how a combinational circuit associated with an IC's DREG can be tested using 1149.1 TAP data register scan operations in a multiple IC environment shown in FIG. 7. The combinational circuit could be a subcircuit in the IC or the entire IC. This type of testing would be done at a higher assembly level where the IC is combined with other ICs to form a system. The system could be anything from a simple electronic toy to complex electronics used in military aircraft. The middle IC of FIG. 7, referred to as the target (T), in the group contains the DREG1 and the combinational circuit of FIG. 5. There are "N" ICs between the target IC's TDI input and the test bus controller's TDO output and "M" IC's between the target ICs TDO and the test bus controller's TDI input.

During test the DISR and DOSR of FIG. 5 operate as described in the test of the combinational circuit in the single IC environment. The only difference between the multiple and single IC test environment is the length of the scan path between the test bus controller and the target IC.

Prior to testing, the test bus controller inputs test commands into the ICs of FIG. 7. ICs 1-N and ICs 1-M are loaded with a Bypass instruction to select their Bypass DREGs, and the target IC (T) is loaded with a test instruction that selects DREG1 and the combinational circuit for testing. In this configuration, the scan path length seen by the test bus controller is N bits (one bit for each IC 1-N), plus the target ICs DREG1 bits, plus M bits (one bit for each IC 1-M).

After loading the test commands the test bus controller inputs control to cause the TAP of each IC to execute multiple data register scan operations. Each data register scan operation repeats the steps of (1) capturing parallel data into the selected DREG of each IC in the scan path, (2) shifting data through the selected DREG of each IC in the scan path to output the captured data and input new test data, and (3) updating to parallel output the new test data from the selected DREG of each IC in the scan path. Steps 1 and 3 (capturing and updating) require one TCK bus cycle each. Step 2 (shifting) requires a number of TCK bus cycles equal to the number of scan cells in the DISR (I) and DOSR (O), plus the number of scan cells in the Bypass DREG of ICs 1-N and 1-M of FIG. 7.

It is important to note that step 1 (parallel capture operation) causes the current data in the DREGs to be overwritten with the data captured. In the multiple IC environment this means that each time an 1149.1 data register scan operation is repeated, the new data to be shifted into the DISR and applied to the combinational circuit must traverse the entire length of Bypass DREGs of ICs 1-N between the test bus controller's TDO output and the target ICs TDI input. Likewise, the data captured in the DOSR of the target IC must traverse the entire length of the Bypass DREGs of ICs 1-M between the target IC's TDO output and the test bus controller's TDI input. The Bypass DREGs of ICs 1-N and 1-M cannot be used to store or pipeline test data between the test bus controller and the target IC.

Equation 7 represents the number of TCK bus cycles required per data register scan operation, equation 2 represents the number of data register scan operations required to completely test the combinational circuit, and equation 8 represents the required test time.

of *TCKs*/scan operation = (*CaptureDR*) + (*ShiftDR*) + (*UpdateDR*)  Eq 7.

= (1 + N + I + O + M + 1)

Where: $N$ = the # of bits before the target *IC*

$I$ = the # of *DISR* bits $O$ = the # of *DOSR* bits $M$ = the # of bits after the target *IC* of Scan Operations = $2^I$ (I = the # of combinational data inputs)  Eq 2.

Test Time=(Eq7)×(Eq2)×(1/*TCK*freq)  Eq8.

To establish a test time calculation benchmark for the multiple IC test environment using multiple 1149.1 TAP data register scan operations to test combinational circuits, assume that; N=500, I=16, O=16, M=500, and the TCK frequency=10 Mhz. The calculated test time to test the combinational circuit is:

Test Time=(1+500+16+16+500+1)×($2^{16}$)×(1/10 Mhz)=6.78 seconds.  Eq8

As in the single IC test environment, the complete testing of the IC in a multiple IC environment may require repeating the test on 100 other combinational circuits. In addition, the system may contain 1000 additional ICs of similar complexity as the one tested. Testing 100 combinational circuits in an IC would take 100×6.78 seconds or 678 seconds or 11.3 minutes. Testing 1000 ICs of similar complexity would take 11,300 minutes or 188 hours or 7.85 days.

The following example describes how a sequential circuit associated with an IC's DREG can be tested using 1149.1 TAP data register scan operations in a multiple IC environment shown in FIG. 7. The sequential circuit could be a subcircuit in the IC or the entire IC. As in the previous multiple IC test description, this type of testing would be done at a higher assembly level where the IC is combined with other ICs to form a system. The middle IC of FIG. 7, referred to as the target (T), in the group contains the DREG1 and sequential circuit of FIG. 6. There are "N" ICs between the target IC's TDI input and the test bus controller's TDO output and "M" ICs between the target ICs TDO and the test bus controller's TDI input.

During test the DISR, CISR, and DOSR of FIG. 6 operate as described in the test of the sequential circuitry in the single IC environment. The only difference between the multiple and single IC test environment is the length of the scan path between the test bus controller and the target IC.

Prior to testing, the test bus controller inputs test commands into the ICs of FIG. 7. ICs 1-N and ICs 1-M are loaded with a Bypass instruction to select their Bypass DREGs, and the target IC (T) is loaded with a test instruction that selects DREG1 and the sequential circuit for testing. In this configuration, the scan path length seen by the test bus controller is N bits (one bit for each IC 1-N), plus the target ICs DREG1 bits, plus M bits (one bit for each IC 1-M).

After loading the test commands the test bus controller inputs control to cause the TAP of each IC to execute multiple data register scan operations. Each data register scan operation repeats the steps of (1) capturing parallel data into the selected DREG of each IC in the scan path, (2) shifting data through the selected DREG of each IC in the scan path to output the captured data and input new test data, and (3) updating to parallel output the new test data from the selected DREG of each IC in the scan path. Step 1 and 3 (capturing and updating) require one TCK bus cycle each. Step 2 (shifting) requires a number of TCK bus cycles equal to the number of scan cells in the DISR (I), CISR (C), and DOSR (O), plus the number of scan cells in the Bypass DREG of ICs 1-N and 1-M of FIG. 7.

Once again, it is important to note that step 1 (parallel capture operation) causes the current data in the DREGs to be overwritten with the data captured. In the multiple IC environment this means that each time an 1149.1 data register scan operation is repeated, the new data to be shifted into the DISR and applied to the sequential circuit must traverse the entire length of Bypass DREGsof ICs 1-N between the test bus controller's TDO output and the target IC's TDI input. Likewise, the data captured in the DOSR of target IC must traverse the entire length of the Bypass DREGs of ICs 1-M between the target IC's TDO output and the test bus controller's TDI input. The Bypass DREGs of ICs 1-N and 1-M cannot be used to store or pipeline test data between the test bus controller and the target IC.

Equation 9 represents the number of TCK bus cycles required per data register scan operation, equation 5 represents the number of data register scan operations required to completely test the sequential circuit, and equation 10 represents the required test time.

$$\text{\# of TCKs/scan operation} = (CaptureDR) + (ShiftDR) + (UpdateDR) \quad \text{Eq 9}$$
$$= (1 + N + I + C + O + M + 1)$$

Where:
- $N$ = the # of bits before the target IC
- $I$ = the # of DISR bits
- $C$ = the # of CISR bits
- $O$ = the # of DOSR bits
- $M$ = the # of bits after the target IC $$\text{\# of Scan Operations} = 2^1 \times (1 + 2K) \quad \text{Eq 5}$$

$$\text{Test Time}=(Eq9)\times(Eq5)\times(1/TCK\text{freq}) \quad \text{Eq10}$$

To establish a test time calculation benchmark for the multiple IC test environment using multiple 1149.1 TAP data register scan operations to test sequential circuits, assume that; N=500, C=1, I=16, K=3, O=16, M=500, and the TCK frequency=10 Mhz. The calculated test time to test the sequential circuit is:

$$\text{Test Time}=(1+500+16+1+16+500+1)\times(2^{16}\times 7)\times(1/10 \text{ Mhz})=47.48 \text{ seconds} \quad \text{Eq10}$$

As in the single IC test environment, the complete testing of the IC in a multiple IC environment may require repeating the test on 100 other sequential circuits. In addition, the system may contain 1000 additional ICs of similar complexity as the one tested.

Testing 100 sequential circuits in an IC would take 4748 seconds or 79.1 minutes. Testing 1000 ICs of similar complexity would take 79,135 minutes or 1,319 hours or 54.95 days.

In view of the foregoing discussion, it is desirable to decrease the test access time to IC circuits via the 1149.1 test bus in both single and multiple IC testing environments.

SUMMARY OF THE INVENTION

The present invention includes a method and apparatus for emulating the operation of a data processing device using a serial bus and without cycling through multiple shift operations.

The present invention provides an emulator for emulating operations of data processing circuitry normally connected to and cooperable with a peripheral circuit. The emulator includes serial scanning circuitry connectable to the peripheral circuit in substitution for the data processing circuitry. The serial scanning circuitry provides to and receives from the peripheral circuit signals which would normally be provided and received by the data processing circuitry. The serial scanning circuitry is connectable to an emulation controller for permitting serial data transfer between the emulation controller and the emulator. The emulator further includes control circuitry connected to the serial scanning circuitry and connectable to the emulation controller. The control circuitry permits the serial scanning circuit to provide and receive the aforementioned signals to and from the peripheral circuit while serial data is being transferred in a continuous serial data stream between the emulation controller and the serial scanning circuitry.

BRIEF DESCRIPTION OF THE DRAWINGS

FIGS. 1–7 illustrate prior art use of serial scan techniques to test electrical circuits;

FIGS. 10a–20d illustrate the operation of the interface between the serial scan test architecture of FIG. 8 and a combinational circuit under test;

FIGS. 11a–11f illustrate the operation of the interface between the test architecture of FIG. 8 and a sequential circuit under test;

FIG. 12 illustrates the use of the test architecture of FIG. 8 in conjunction with a combinational circuit under test;

FIG. 13 illustrates the use of the test architecture of FIG. 8 in conjunction with a sequential circuit under test;

FIG. 15 is a block diagram which illustrates the interface between a test control unit and an integrated circuit having the test architecture illustrated in FIG. 14;

FIG. 16 is a block diagram which illustrates how test data is framed for use in the test architecture of FIG. 14;

FIG. 17 is a block diagram which illustrates another test architecture capable of testing a plurality of electrical circuits concurrently;

FIG. 18 is a block diagram which illustrates the test control unit of FIG. 15;

FIG. 19 is a state diagram of the programmable I/O controller of FIG. 9;

FIG. 20 is a state diagram illustrating a portion of the FIG. 19 state diagram in further detail;

DETAILED DESCRIPTION

The present invention includes a controller designed for use in 1149.1 architectures or any other type of serial based test architecture with any desired scan clocking arrangement. This controller, referred to as a Boundary Input/Output Serializer (BIOS), provides the internal timing and control required to allow a DREG to more efficiently input test patterns to and output test patterns from the boundary of sequential or combinational circuits during a single 1149.1 data register scan operation. The advantage of the BIOS is it eliminates the need of having to repetitively cycle through multiple 1149.1 data register scan operations to test a circuit.

Figure 8:
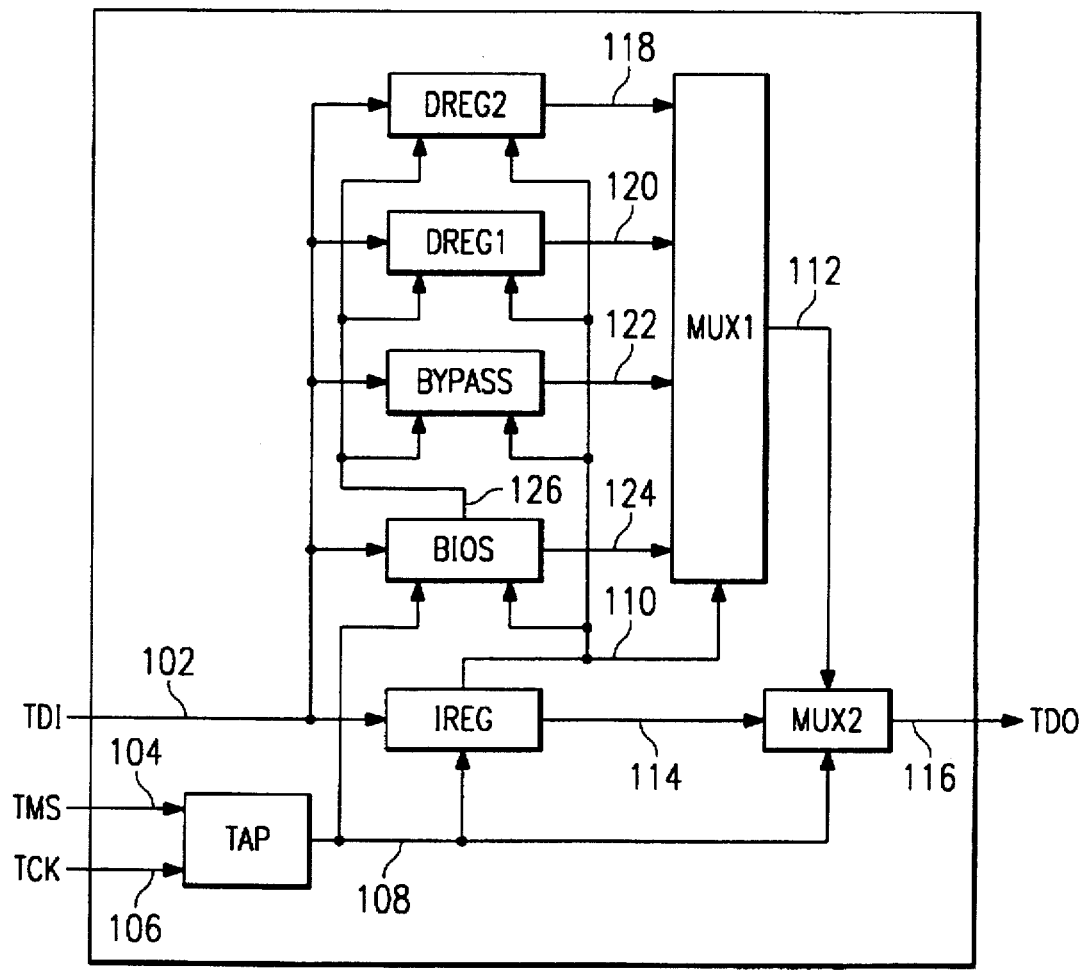
FIG. 8 is a block diagram which illustrates a serial scan test architecture according to the present invention.

In the exemplary embodiment of FIG. 8, the BIOS is shown in use with the 1149.1 architecture. The BIOS receives input from TDI 102, control bus 108, and control bus 110. The BIOS outputs control to DREGs via control bus 126 and serial data to TDO 116 via multiplexers MUX1 and MUX2. The BIOS is selected by the instruction register via control bus 110 to shift data from the TDI input to the TDO output the same way a DREG is selected. Once selected a test bus controller can input control to the TAP via TMS and TCK to cause the TAP to output control on bus 108 to shift data into and out of the BIOS during a data register scan operation. The data shifted into the BIOS programs it for testing a particular circuit associated with a DREG, thus one BIOS can be used to serialize test patterns into and out of any DREG in the 1149.1 test architecture. After the BIOS has been programmed for testing a particular DREG and associated circuit, another instruction can be scanned into the instruction register to enable the BIOS to perform the test during the next data register scan operation.

When the BIOS is disabled, a connection is made between the TAP control bus input 108 and the BIOS control bus output 126 to allow the DREGs to be accessed directly by the TAP using standard 1149.1 data register scan operations as described above. When the BIOS is enabled, the internal controller of the BIOS synchronizes up to the TAP control bus 108 during a data register scan operation and outputs control to the selected DREG via control bus 126 to serialize data in and out of the DREG.

Figure 9:
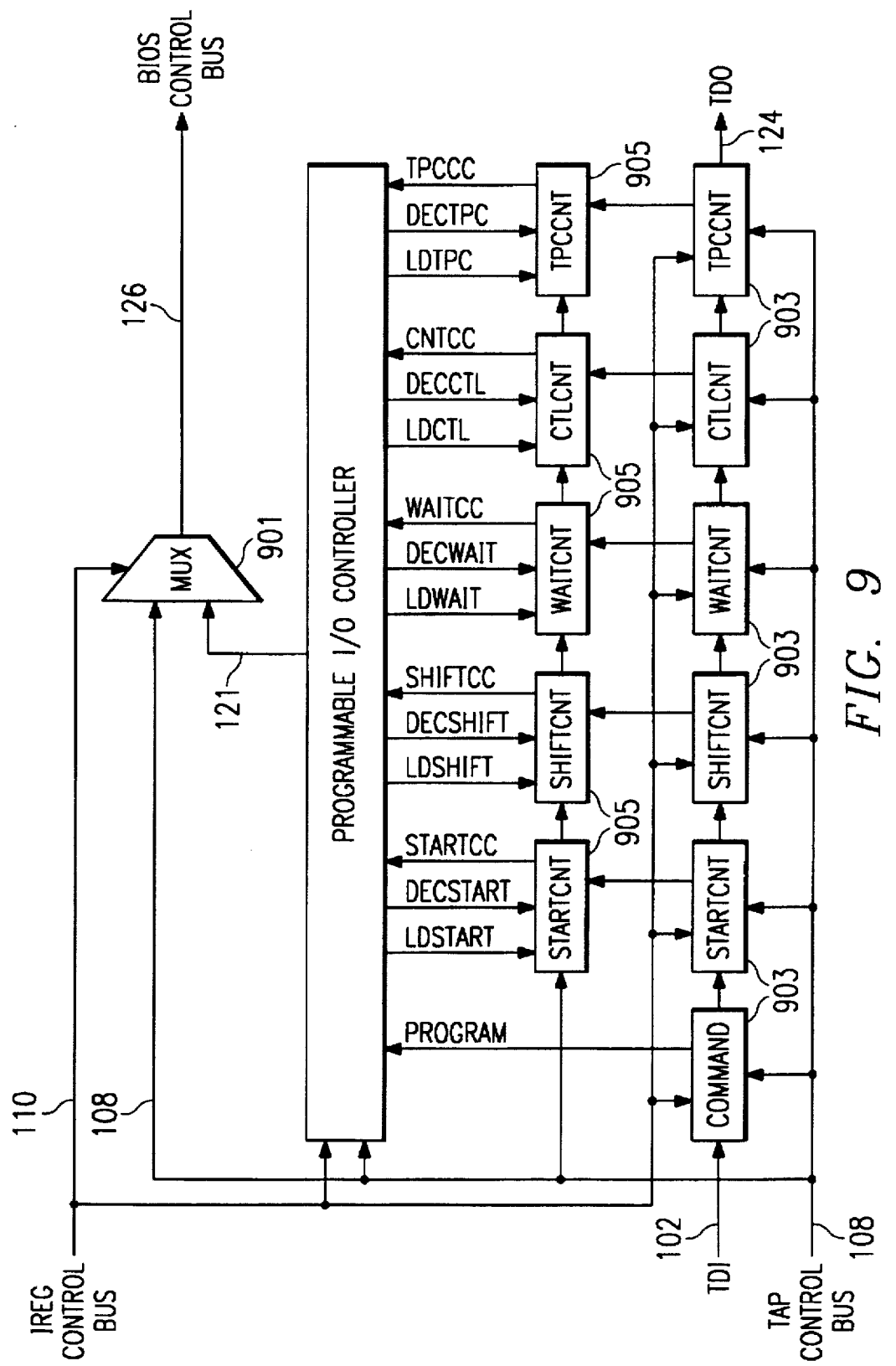
FIG. 9 is a block diagram which illustrates the BIOS of FIG. 8.

FIG. 9 shows one example implementation of the BIOS. The BIOS includes a programmable I/O controller, a control bus multiplexer 901, a series of shift register sections 903, and a series of counters 905 associated with certain shift register sections.

The programmable I/O controller is a state machine that regulates the serial test applied to a particular DREG and related circuit. As the following description will make clear to those skilled in the art, a suitable state machine capable of performing the functions of the programmable I/O controller can be designed using conventional, commercially available digital logic macros. The programmable I/O controller receives programming input from the command shift register, a start count complete (startcc) input from the startcnt counter, a shift count complete (shiftcc) input from the shiftcnt counter, a wait count complete (waitcc) input from the waitcnt counter, a control count complete (ctlcc) input from the ctlcnt counter, a test pattern cycle count complete (tpccc) signal from the test pattern cycle counter (tpccnt), timing and control input from the TAP control bus 108, and control input from the instruction control bus 110. The programmable I/O controller outputs test control to the control bus multiplexer via bus 121, a load start (ldstart) counter signal and decrement start (decstart) signal to the startcnt counter, a load shift (ldshift) counter signal and a decrement shift (decshift) counter signal to the shiftcnt counter, a load wait (ldwait) counter signal and a decrement wait (decwait) counter signal to the waitcnt counter, a load control (ldctl) counter signal and a decrement control (decctl) counter signal to the ctlcnt counter, and a load test pattern cycle (ldtpc) counter signal and a decrement test pattern cycle (dectps) counter signal to the tpccnt counter.

The control bus multiplexer 901 outputs control to the DREGs via bus 126, and receives the BIOS control bus 121, TAP control bus 108, and bus selection input from the instruction register bus 110. The startcnt counter outputs a startcc signal to the programmable I/O controller and receives data input from startcnt shift register, the ldstart and decstart count signals from the programmable I/O controller, and load control input from the TAP control bus 108. The shiftcnt counter outputs a shiftcc signal to the programmable I/O controller and receives data input from shiftcnt shift register, the decshift count and ldshift count signals from the programmable I/O controller, and load control input from the TAP control bus 108. The waitcnt counter outputs a waitcc signal to the programmable I/O controller and receives data input from waitcc shift register, the decwait count and ldwait count signals from the programmable I/O controller, and load control input from the TAP control bus 108. The ctlcnt counter outputs a ctlcc signal to the programmable I/O controller and receives data input from ctlcnt shift register, the decctl count and ldctl count signals from the programmable I/O controller, and load control input from the TAP control bus 108. The tpccnt counter outputs a tpccc signal to the programmable I/O controller and receives data input from the tpccnt shift register, the ldtpc and dectpc count signals from the programmable I/O controller, and load control input from the TAP control bus 108.

The command shift register outputs control data to the programmable I/O controller and serial data to the startcnt shift register. The command shift register receives shift control input from TAP control bus 108, serial data input from TDI 102, and shift enable input from instruction register control bus 110. The startcnt shift register outputs count data to the startcnt counter and serial data to the shiftcnt shift register. The startcnt shift register receives shift control input from TAP control bus 108, serial data input from the command shift register, and shift enable input from instruction register control bus 110. The shiftcnt shift register outputs count data to the shiftcnt counter and serial data to the waitcnt shift register. The shiftcnt shift register receives shift control input from TAP control bus 108, serial data input from the startcnt shift register, and shift enable input from instruction register control bus 110. The waitcnt shift register outputs count data to the waitcnt counter and serial data to the ctlcnt shift register. The waitcnt shift register receives shift control input from TAP control bus 108, serial data input from the shiftcnt shift register, and shift enable input from instruction register control bus 110. The ctlcnt shift register outputs count data to the ctlcnt counter and serial data to the tpccnt shift register. The ctlcnt shift register receives shift control input from TAP control bus 108, serial data input from the waitcnt shift register, and shift enable input from instruction register control bus 110. The tpccnt shift register outputs count data to the tpccnt counter and serial data to the TDO output. The tpccnt shift register receives shift control input from TAP control bus 108, serial data input from the ctlcnt shift register, and shift enable input from instruction register control bus 110.

The control bus multiplexer 901 selects whether the TAP control bus 108 or the BIOS control bus 121 is output to the DREGs. When testing is being performed by the TAP, as previously described, the instruction register control bus 110 will select the TAP control bus 108 to be output from the control bus multiplexer via bus 126. When testing is being performed by the BIOS, the instruction register control bus 110 will select the BIOS control bus to be output from the control bus multiplexer via bus 126.

After the shift registers 903 have been loaded with data via a data register scan operation, the data in the command shift register section can be loaded into the programmable I/O controller and the data in the remaining shift register sections can be loaded into the corresponding counters by causing the TAP to enter its UPDATEDR state. Thereafter, an instruction is shifted into the instruction register to enable the programmable I/O controller to execute a test. In response to the enable input from the instruction register, the programmable I/O controller is armed and ready to start the test when the TAP enters the SHIFTDR state.

Figure 19:
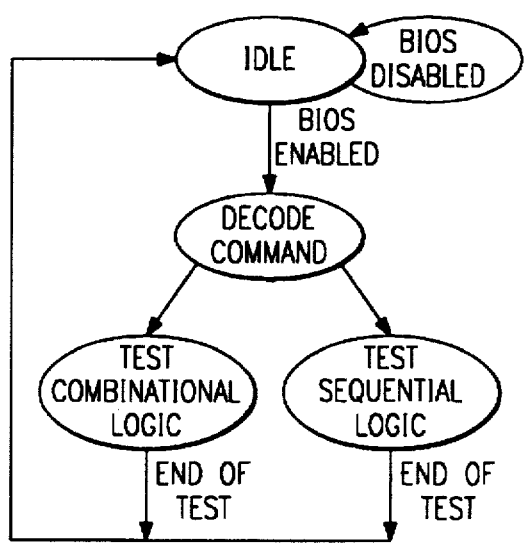

The command shift register is used to program or configure the programmable I/O controller for testing either combinational or sequential circuits (see state diagram of FIG. 19) boundaried by a DREG. In sequential circuit testing, the programming input adapts the BIOS control bus for the particular type of control input required to test a sequential circuit. For example, if the sequential circuit is a Ram memory the programming input adapts the output control from the BIOS on bus 121 to act as control signals (chip select, read strobe, write strobe) required to perform memory read and/or write cycle operations. If the sequential circuit is a simple state machine with a single clock input, the programming input adapts the output control from the BIOS to perform simple clocking functions. If the sequential circuit is a complex microprocessor requiring multiple clock and control input sequences to execute an internal microcode instruction cycle, the programming input adapts the output control from the BIOS to perform complex clocking and control functions. The programmed output control functions from the BIOS are timed by TCK bus cycles while the TAP is in the SHIFTDR state.

Figure 22:
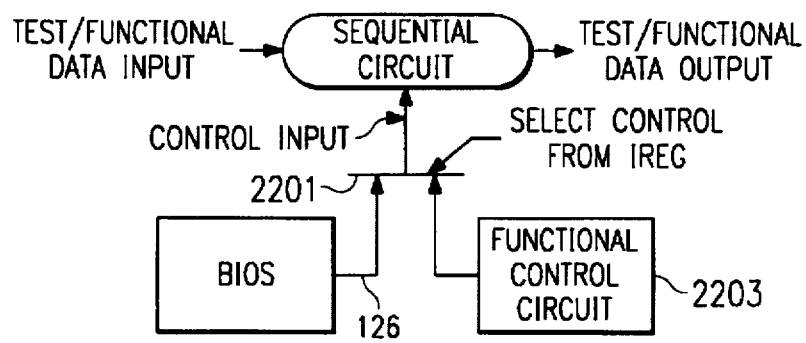
FIG. 22 is a block diagram which illustrates the connection in FIG. 13 between the BIOS and the sequential circuit under test.

In FIG. 22, a multiplexer 2201 selects the control input to the sequential circuit to come from either the normal functional control circuit 2203 or from the BIOS control bus 126. The control to switch the multiplexer 2201 comes from a select control signal from instruction register IREG.

Figure 23:
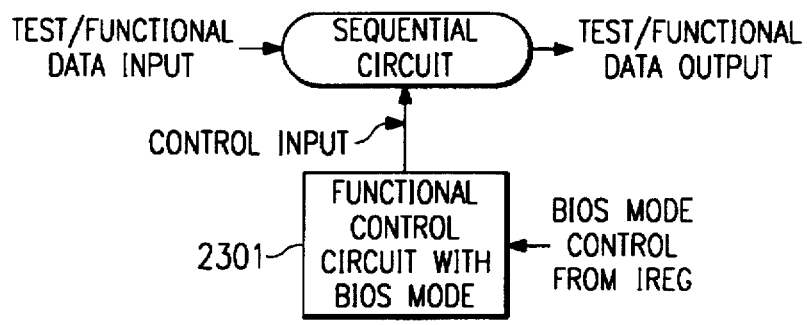
FIG. 23 is a block diagram illustrating an alternative to the structure of FIG. 22.

In FIG. 23, the normal functional control circuit 2301 is designed with the BIOS control functionality embedded therein. During normal operation, the sequential circuit control input is driven by the normal control functionality of circuit 2301. During test operation, a BIOS mode control signal from instruction register IREG switches the circuit 2301 into a BIOS mode wherein the embedded BIOS control functionality is selected to drive the control input of the sequential circuit.

Figure 20:
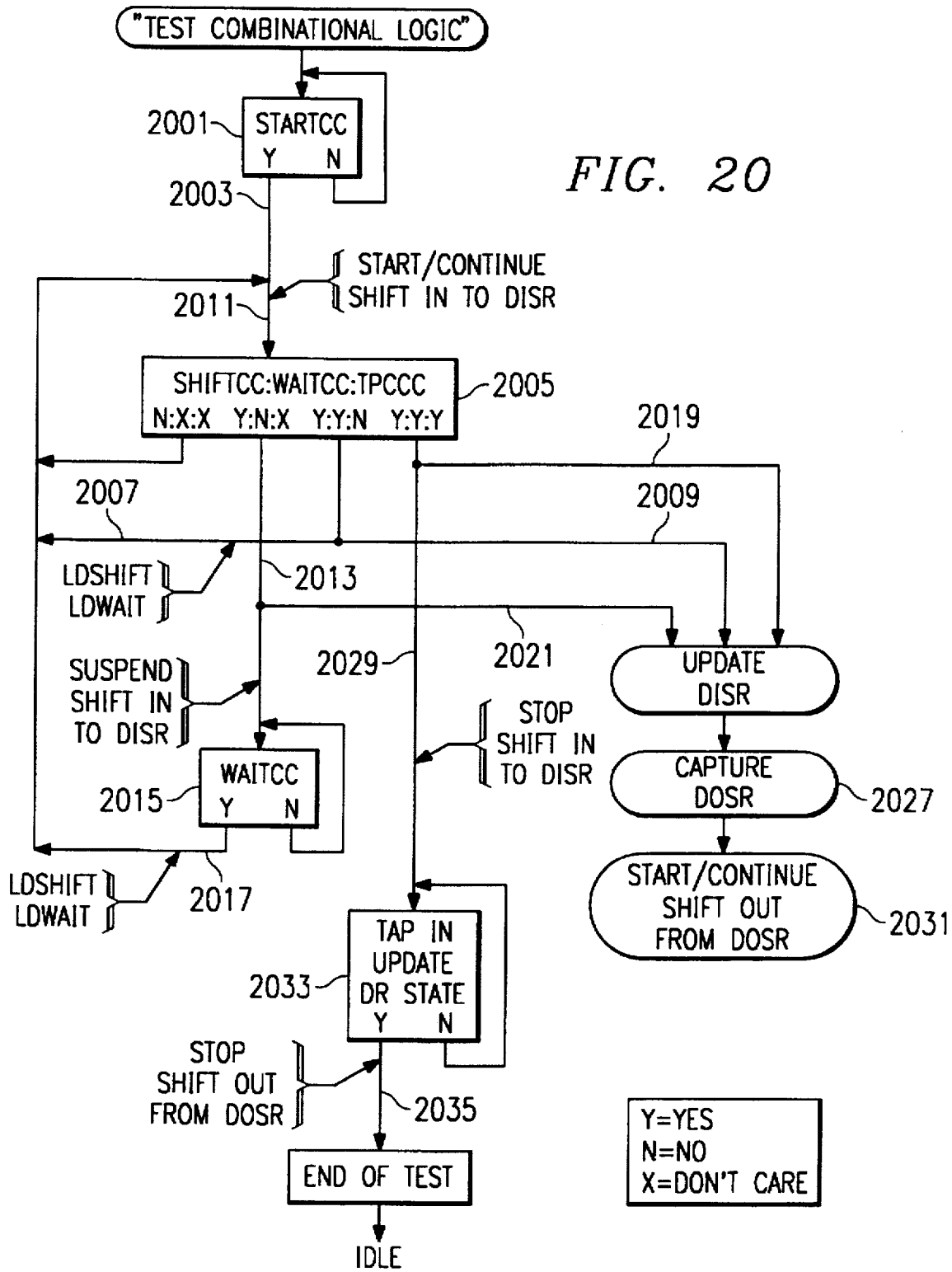

The startcnt counter is used to delay the start of a test operation for a predetermined number of data shift cycles while the TAP is in the SHIFTDR states. If the startcnt counter is not at a minimum count, the programmable I/O controller will not receive a startcc signal. If the startcc signal is not received and the TAP is in the SHIFTDR state, the programmable I/O controller will decrement the startcnt counter on each TCK bus cycle until the startcc signal is received. After receiving the startcc signal the programmable I/O controller will output control on bus 126 to start the test by enabling the serial data input to the TDI input from the test bus controller to be shifted into the DISR of the selected DREG. See 2001 and 2003 in FIG. 20.

The reason for needing to delay the test is to allow time for the serial data output from the test bus controller to traverse shift register bits in ICs preceding the target IC. In the multiple IC environment of FIG. 7, it is seen that the serial data from the test bus controller must pass through ICs 1-N before being input to the target IC (T). If each IC 1-N has one bit the startcnt would be set to a count of N to delay the test until the serial data from the test bus controller arrives. If no ICs lie between the test bus controller and the target IC (FIG. 4) the startcnt is set to the count complete condition (startcc) to enable the test to start immediately.

While a counter is shown supplying the method of delaying the start of a test operation, other methods could just as well have been utilized. For example, a unique serial data packet or header can be sent by the test bus controller and received by the target IC to start the test. Another method would be to indicate the start of a test by the test bus controller causing the TAP of the target IC to cycle from the SHIFTDR state into the PAUSEDR state and back to the SHIFTDR state a first time. These and other starting methods are described in aforementioned document T1-14996B.

The shiftcnt counter is used to input a predetermined number of serial data bits into the DISR section of a DREG.

The count loaded into the shiftcnt counter from the shiftcnt shift register is equal to the bit length of the selected DISR. When the shift in operation begins the shiftcnt is decremented each time a bit is shifted into the DISR. When the last bit is shifted into the DISR the shiftcnt counter outputs a shiftcc signal to the programmable I/O controller, indicating the DISR is full. The programmable I/O controller then outputs control on the ldshift signal to reload the shiftcnt counter for another DISR shift in operation. In addition to reloading the shiftcnt counter, the programmable I/O controller also outputs control to the DISR to cause the test data pattern that has been shifted into the DISR to be parallel input to the circuit under test. This is also referred to as an update operation. See 2005, 2007 and 2009 in FIG. 20.

If the circuit under test is a combinational type, the programmable I/O controller outputs additional control steps following the input test pattern update operation to; (1) capture the parallel output response data from the combinational circuit into the DOSR, and (2) cause the DOSR to shift the captured response data out to the test bus controller via the TDO output.

If the circuit under test is a sequential type, the programmable I/O controller outputs additional control steps following the input test pattern update operation to; (1) input control to the sequential circuit to allow it to respond to the input test pattern from the DISR, (2) capture the parallel output response data from the sequential circuit into the DOSR, and (3) cause the DOSR to shift the response data out to the test bus controller via the TDO output.

Thus the shiftcnt counter and programmable I/O controller operate autonomously to produce the control required to test either combinational or sequential circuits. While the test is being performed the 1149.1 TAP controller remains in the SHIFTDR state continuously shifting data in and out of the circuit. If the TAP transitions into the PAUSEDR state from the SHIFTDR state the test will be suspended until the TAP transitions back into the SHIFTDR state from the PAUSEDR state (see FIG. 2). Since the BIOS controls the test, the TAP no longer needs to cycle through multiple data register scan operation states to execute a test, thus its role during test is reduced to only starting the test, shifting data in and out, and stopping the test.

The waitcnt counter is used to suspend the shifting in of data into the DISR of a DREG for a predetermined number of serial shift operations. The count loaded into the waitcnt counter from the waitcnt shift register is equal to the number of shift operations to suspend. In some DREG applications the DISR bit length will be less than the DOSR bit length. In these situations the waitcnt counter allows for matching up the bit lengths of the serial input and output operations by enabling the DISR to have wait states. During a wait state the DISR will not shift in a serial bit. The test bus controller inserts dummy wait state input bits in the serial test input bit stream at predetermined intervals so that the true test data bits are not lost when the DISR goes into wait states.

The waitcc signal from the waitcnt counter is inspected each time the programmable I/O controller receives a shiftcc signal from the shiftcnt counter. If the waitcc signal is received (indicating no wait is required) the programmable I/O controller continues shifting test data into the DISR. See 2007 and 2011 in FIG. 20. However, if the waitcc signal is not received, the programmable I/O controller suspends the shift in operation to the DISR until the wait count in the waitcnt counter has reached a minimum value, indicated by receiving a waitcc signal. See 2013 and 2015 of FIG. 20. The programmable I/O controller decrements the waitcnt on each TCK bus cycle. When the waitcc signal is received, the programmable I/O controller reloads both the shiftcnt and waitcnt counters and resumes the next shift in operation to the DISR. See 2017 and 2011 in FIG. 20.

The ctlcnt counter is used to input test control to sequential circuits for a predetermined number of TCK bus cycles. The count loaded into the ctlcnt counter from the ctlcnt shift register is equal to the number of TCK bus cycles required to generate the control input to the sequential circuit. The control input causes the sequential circuit to respond to the test data input from the DISR and output the response data to the DOSR to be captured and shifted out for inspection.

Figure 21:
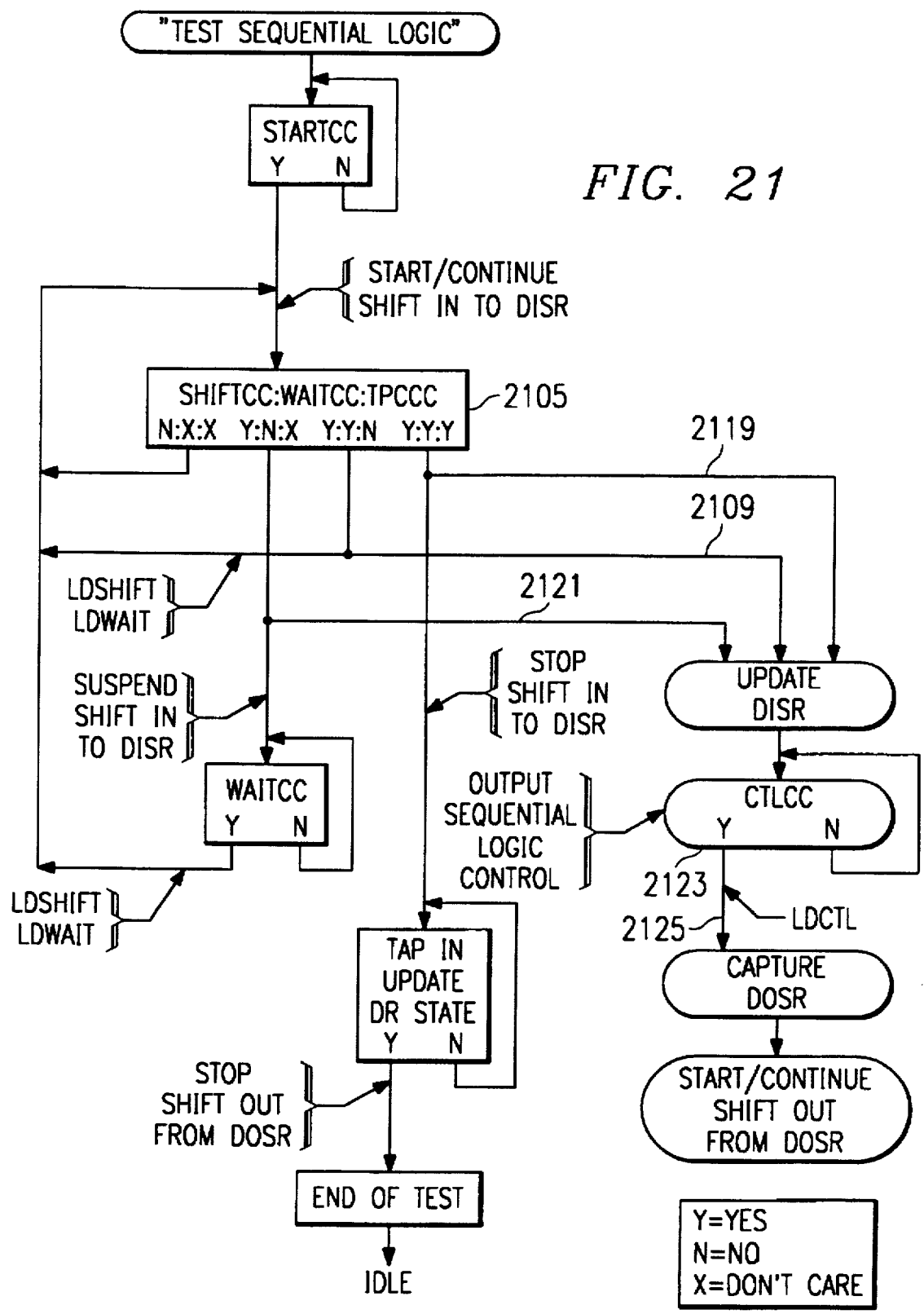
FIG. 21 is a state diagram illustrating another portion of the FIG. 19 state diagram in further detail.

The ctlcc signal from the ctlcnt counter is inspected each time the programmable I/O controller receives a shiftcc signal from the shiftcnt counter. See 2105, 2109, 2119, 2121 and 2123 of FIG. 21. If the ctlcc signal is received (indicating no control is required and the circuit under test is combinational) the programmable I/O controller does not output control and continues the next input cycle of shifting test data into the DISR. However, if the ctlcc signal is not received, the circuit under test is sequential and the programmable I/O controller starts outputting control to the sequential circuit while at the same time starts the next input cycle of shifting test data into the DISR.

The programmable I/O controller outputs control until the ctlcnt counter has reached a minimum value, indicated by receiving a ctlcc signal. The programmable I/O controller decrements the ctlcnt counter on each TCK bus cycle. When the ctlcc signal is received, the programmable I/O controller stops outputting control to the sequential circuit and outputs control to reload the count in the ctlcnt shift register into the ctlcnt counter (see 2125 of FIG. 21), to be used for the next test pattern to be input to the sequential circuit. In the event the number of TCK bus cycles required to generate the control input to the sequential circuit exceeds the number of TCK bus cycles required to shift in the next input test pattern, the BIOS will utilize wait states as described in the waitcnt counter description.

The tpccnt counter is used to terminate the BIOS controlled test operation after a predetermined number of test patterns have been input to and output from the circuit being tested, via the DISR and DOSR. The programmable I/O controller inspects the tpccc signal from the tpccnt counter when it executes the capture step to the DOSR at the end of each test pattern cycle (see 2005, 2009, and 2019 of FIG. 20) as described in the shiftcnt counter description. If the tpccnt counter is not at a minimum count, the programmable I/O controller will not receive a tpccc signal. In response to not receiving the tpccc signal the programmable I/O controller outputs control on the dectpc signal to decrement the count in the tpccnt counter and continues executing the steps for another test pattern input/output cycle (see 2005 and 2007).

If the tpccnt counter is at a minimum, the programmable I/O controller will receive a tpccc signal. In response to receiving the tpccc signal the programmable I/O controller will output control to; (1) allow the last output pattern loaded into the DOSR from the circuit output during the capture step to be shifted out of the TDO output, through any intermediate shift stages (such as Bypass DREGs on ICs 1-M in FIG. 7) and input to the test bus controller (2005, 2019, 2027), (2) inhibit any further shift in operations to the DISR (2029), and (3) inhibit any further update (UP), control (CT), and capture (CP) steps. In addition, when the last output pattern bit is shifted out of the DOSR, the DOSR will output fixed level logic bits to the TDO output (2031) until the last output pattern is received by the test bus controller and the test bus controller terminates the data register scan operation by causing the TAP to exit from the SHIFTDR state into the RT/IDLE state, via the EXIT1DR and UPDATEDR states (2033, 2035).

If the test bus controller causes the TAP to repeat the same BIOS controlled test operation, the counters are again loaded and the programmable I/O controller becomes armed to start the test when the TAP enters the SHIFTDR state and the startcnt outputs a startcc signal.

Under control input from the command register, the programmable I/O controller can be made to ignore the tpccc input from the tpccnt and continue the test pattern input/output cycles as long as the test bus controller continues the data register scan operation in the SHIFTDR state.

There are three BIOS testing cases for a DREG associated with combinational circuits; (1) DISR length=DOSR length, (2) DISR length>DOSR length, and (3) DISR length<DOSR length. In each case, the BIOS is shown inputting control to the DISR and DOSR.

Figure 10A:
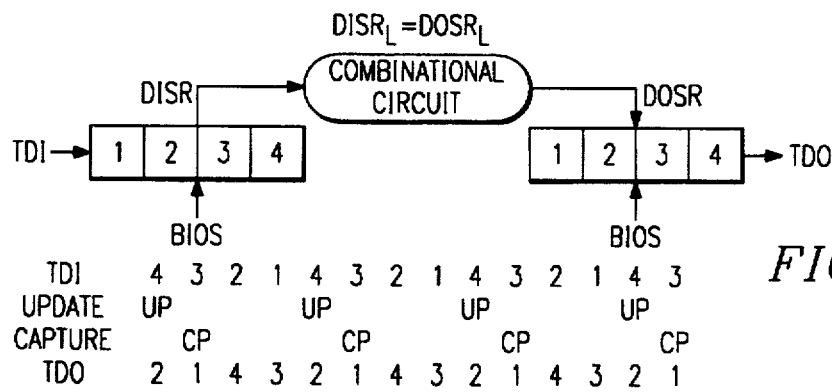

Case 1 is illustrated in FIG. 10a and occurs when the length of the DISR and DOSR are exactly the same. In FIG. 10a, the DISR and DOSR are both 4-bits in length. During test operations, the BIOS inputs shift in and update (UP) control into DISR and capture (CP) and shift out control to the DOSR while the TAP is in the SHIFTDR state. The test involves repeating the steps of; (1) shifting a 4-bit test pattern from the test bus controller into the DISR, (2) updating the 4-bit test pattern and inputting it to the combinational circuit, (3) capturing the 4-bit output response from the combinational circuit into the DOSR, and (4) shifting out the captured 4-bit response pattern to the test bus controller for processing.

The update control input to the DISR from the BIOS occurs during the TCK bus cycle following the TCK bus cycle that shifts the last serial test bit (bit1) into the DISR. The capture control input to the DOSR from the BIOS occurs on the TCK bus cycle following the update TCK bus cycle. The shift out operation of the 4-bit response pattern is started following the capture TCK bus cycle and continues until the next capture TCK bus cycle. Since the DISR and DOSR are the same length, no wait states or dummy serial bits are required in the input/output serializing process.

Figure 10B:
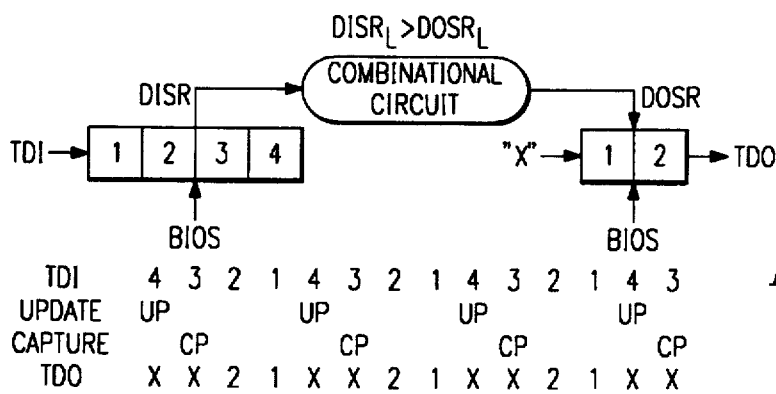

Case 2 is illustrated in FIG. 10b and occurs when the length of the DISR is greater than the length of the DOSR. In FIG. 10b, the DISR is 4-bits in length and the DOSR is 2-bits in length. Testing is accomplished the same way as described in case 1, and involves repeating the steps of; (1) shifting a 4-bit test pattern from the test bus controller into the DISR, (2) updating the 4-bit test pattern and inputting it to the combinational circuit, (3) capturing the 2-bit output response from the combinational circuit into the DOSR, and (4) shifting out the captured 2-bit response pattern plus two bits of dummy response patterns (X) shifted into the DOSR from a fixed logic level input to the serial input of the DOSR. As the 2-bit response pattern is shifted out of the DOSR, the fixed dummy bits (X) are shifted into the 2-bit DOSR and shifted out to the test bus controller immediately after the 2-bit response pattern. The test bus controller receiving the serial 2-bit response pattern and 2-bit dummy pattern will strip off the dummy bits after receiving the 2-bit response pattern so that only the 2-bit response pattern is processed.

The update control input to the DISR from the BIOS occurs during the TCK bus cycle following the TCK bus cycle that shifts the last serial test bit (bit1) into the DISR. The capture control input to the DOSR from the BIOS occurs on the TCK bus cycle following the update TCK bus cycle. The shift out operation of the 2-bit response pattern plus 2-bit dummy pattern is started following the capture TCK bus cycle and continues until the next capture TCK bus cycle.

Figure 10C:
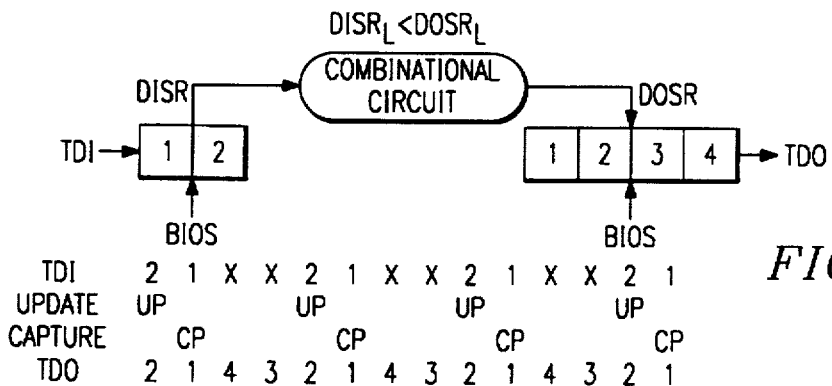

Case 3 is illustrated in FIG. 10c and occurs when the length of the DISR is less than the length of the DOSR. In FIG. 10c, the DISR is 2-bits in length and the DOSR is 4-bits in length. Testing is accomplished the same way as described in case 1 except that the BIOS additionally inputs control to the DISR to provide wait states during the shift in process. Testing of case 3 involves repeating the steps of; (1) shifting a 2-bit test pattern from the test bus controller into the DISR, (2) suspending the shift in operation to the DISR for two wait states or TCK bus cycles, (3) updating the 2-bit test pattern and inputting it to the combinational circuit, (4) capturing the 4-bit output response from the combinational circuit into the DOSR, and (5) shifting out the captured 4-bit response pattern to the test bus controller for processing. The wait states are represented by dummy bits (X) which are inserted by the test bus controller, but ignored by the BIOS during step (2) above. It should also be clear that steps (1) and (2) can be reversed so that the wait states (i.e. the dummy bits) precede the shifting of the 2-bit test pattern into the DISR. In such case, the shift in operation of the DISR need not be suspended at all, because the dummy bits will be shifted through the DISR ahead of the test pattern. The wait states/dummy bits may be implemented in any desired manner, as long as the test pattern is positioned correctly in the DISR prior to the update operation.

The update control input to the DISR from the BIOS occurs during the TCK bus cycle following the second wait state. The capture control input to the DOSR from the BIOS occurs on the TCK bus cycle following the update TCK bus cycle. The shift out operation of the 4-bit response pattern is started following the capture TCK bus cycle and continues until the next capture TCK bus cycle. By including two wait states, the data shifted into the DISR and data shifted out of the DOSR are made to appear to be the same length. The test bus controller inserts the two dummy bits (X) after the 2-bit input pattern so that the next input pattern will not be lost and will be available to be shifted into the DISR when shifting operations resume following the two wait states.

Figure 10D:
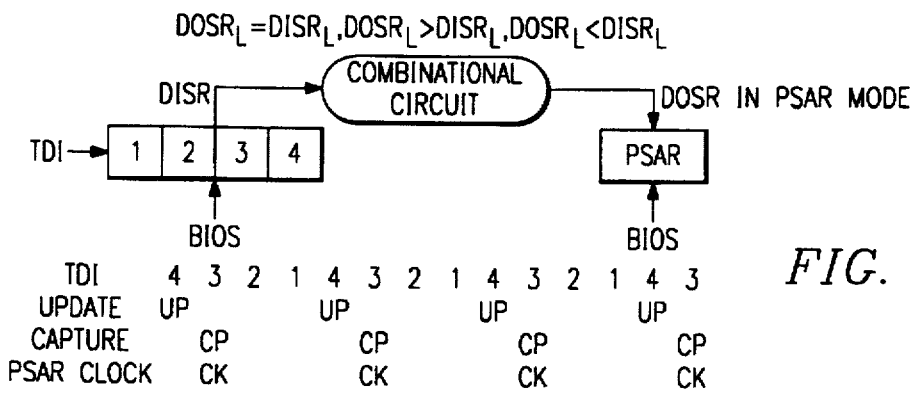

In the three cases for testing combinational circuits, the DOSR has been shown to be a parallel load, serial output type circuit. If desired, the DOSR can be made to operate as a parallel input signature analysis register (PSAR) to allow a signature to be taken of the parallel data output from the combinational circuit, as shown in FIG. 10d. The use of PSARs for compacting test data is well known to those skilled in the art of testing.

If the DOSR is required to operate as a PSAR the command register of the BIOS of FIG. 9 will be loaded with programming control to modify the DOSR of the selected DREG to operate as a PSAR. The programming control is input to the DOSR by control bus 126 via the control multiplexer 901 and programmable I/O controller bus 121. Also the DOSR will be loaded with a known seed or initial value prior to performing the test.

When the DOSR operates as a PSAR, the capture control input (CP) to the DOSR from the BIOS is applied following the update control input (UP) as shown in FIG. 10d. With each capture input, a PSAR clock is generated in the PSAR to compress the parallel data received from the combinational circuit outputs in with the previous value in the PSAR.

When operating as a PSAR, the DOSR does not shift data out the TDO pin after the capture input. At the end of the test, the test bus controller will input an instruction to allow the test signature to be shifted out of the DOSR via the TDO output for inspection.

One benefit of using the DOSR as a PSAR instead of a parallel input/serial output register is that the shift out operation is not required, and the task of the test bus controller is reduced to only having to input serial data to the circuit under test via the DISR. Another very important benefit of operating the DOSR as a PSAR is that it eliminates the need for wait states to be added into the input test pattern bit stream to the DISR for case 3 (DISRl<DOSRl) in FIG. 10c. The wait states can be removed because the DOSR does not shift data out, thus the input wait states are not required and the first bit of the next input test pattern bit stream can be input to the DISR immediately following the last bit of the previous input test pattern bit stream. Eliminating the wait states reduces the test time for case 3 type combinational circuits.

The DISR has been described as having a shift register section to accept serial data input from the TDI and test bus control and an update register section to accept the test pattern shifted into the shift register after a predetermined number of shift cycles. The test pattern accepted into the update register is input to the combinational circuit as a parallel test input pattern. The combinational circuit reacts to all its inputs receiving a test stimulus input at the same time and outputs a response pattern on all its outputs to the DOSR. The response pattern from the combinational circuit is captured into the DOSR and shifted out to the Test bus controller via the TDO output for inspection.

The update register is not needed for all types of testing, but does play an important role if it is desired to test the propagation delay of the combinational circuit. Without the update register, the combinational circuit receives input changes each time the shift register section of the DISR accepts a serial bit input. With the update register, the combinational circuit only receives input changes when the BIOS updates the update register. By controlling when the inputs to the combinational circuit change, it is possible to input deterministic pattern sequences that can test timing sensitivities of the combinational circuit. For example, a simultaneous input change from all zero logic inputs to all one logic inputs may exercise particular signal decoding paths through the combinational circuit that have critical propagation delay timing requirements that must be tested. This pattern input sequence could not be performed without the update register.

Since the BIOS outputs capture control to the DOSR one TCK bus cycle after it outputs update control to the DISR, the propagation delay time of the combinational circuit from receiving an input stimulus pattern to outputting an output response pattern can be tested by suitably adjusting the frequency of the TCK.

There are three BIOS testing cases for a DREG associated with sequential circuits; (1) DISR length=DOSR length, (2) DISR length DOSR>length, and (3) DISR length<DOSR length. In each case, the BIOS is shown inputting control to the DISR, sequential circuit, and DOSR. The control input to the sequential circuit from the BIOS is actually coupled to the sequential circuit in place of the normal functional control inputs to the sequential circuit by control output from the instruction register, as shown in above discussed FIGS. 22–23.

Figure 11A:
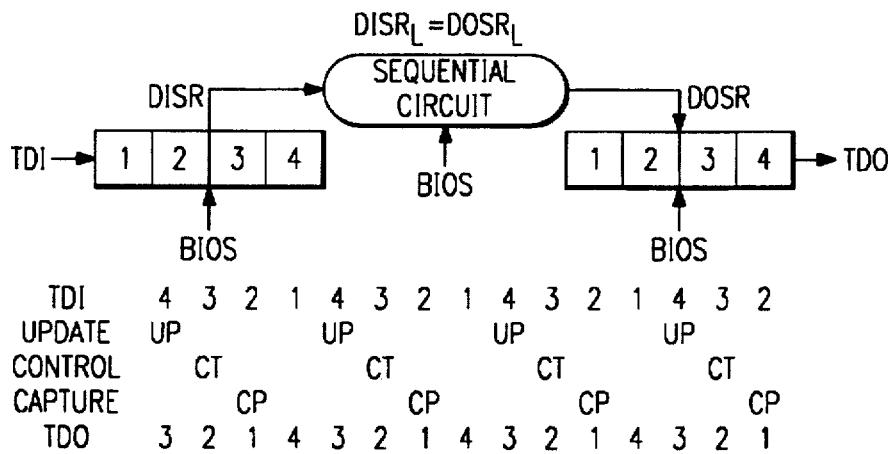

Case 1 is illustrated in FIG. 11a and occurs when the length of the DISR and DOSR are exactly the same. In FIG. 11a, the DISR and DOSR are both 4-bits in length. During test operations, the BIOS inputs shift in and update (UP) control into DISR, control (CT) input to the sequential circuit, and capture (CP) and shift out control to the DOSR while the TAP is in the SHIFTDR state. The test involves repeating the steps of; (1) shifting a 4-bit test pattern from the test bus controller into the DISR, (2) updating the 4-bit test pattern and inputting it to the sequential circuit, (3) inputting control to the sequential circuit to allow the sequential circuit to respond to the 4-bit input pattern from the DISR and output a 4-bit response pattern to the DOSR, (4) capturing the 4-bit output response pattern from the sequential circuit into the DOSR, and (5) shifting out the captured 4-bit response pattern to the test bus controller for processing.

The update control input to the DISR from the BIOS occurs during the TCK bus cycle following the TCK bus cycle that shifts the last serial test bit (bit1) into the DISR. The control input to the sequential circuit from the BIOS occurs on the TCK bus cycle following the update TCK bus cycle. The capture control input to the DOSR from the BIOS occurs on the TCK bus cycle following the sequential control input TCK bus cycle. The shift out operation of the 4-bit response pattern is started following the capture TCK bus cycle and continues until the next capture TCK bus cycle. Since the DISR and DOSR are the same length, no wait states or dummy serial bits are required in the input/output serializing process.

Figure 11B:
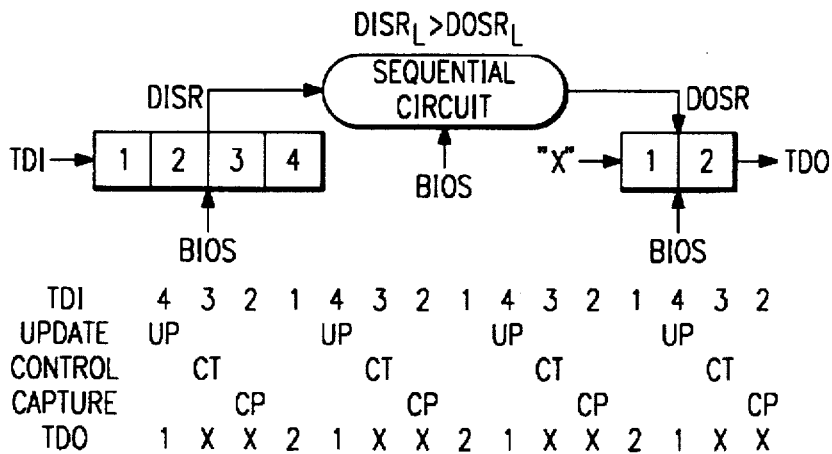

Case 2 is illustrated in FIG. 11b and occurs when the length of the DISR is greater than the length of the DOSR. In FIG. 11b, the DISR is 4-bits in length and the DOSR is 2-bits in length. Testing is accomplished the same way as described in case 1, and involves repeating the steps of; (1) shifting a 4-bit test pattern from the test bus controller into the DISR, (2) updating the 4-bit test pattern and inputting it to the sequential circuit, (3) inputting control to the sequential circuit to allow the sequential circuit to respond to the 4-bit input pattern from the DISR and output a 2-bit response pattern to the DOSR, (4) capturing the 2-bit output response from the sequential circuit into the DOSR, and (5) shifting out the captured 2-bit response pattern plus two bits of dummy response patterns (X) shifted into the DOSR from a fixed logic level input to the serial input of the DOSR. As the 2-bit response pattern is shifted out of the DOSR, the fixed dummy bits (X) are shifted into the 2-bit DOSR and shifted out to the test bus controller immediately after the 2-bit response pattern. The test bus controller receiving the serial 2-bit response pattern and 2-bit dummy pattern will strip off the dummy bits after receiving the 2-bit response pattern so that only the 2-bit response pattern is processed.

The update control input to the DISR from the BIOS occurs during the TCK bus cycle following the TCK bus cycle that shifts the last serial test bit (bit1) into the DISR. The control input to the sequential circuit from the BIOS occurs on the TCK bus cycle following the update TCK bus cycle. The capture control input to the DOSR from the BIOS occurs on the TCK bus cycle following the sequential control TCK bus cycle. The shift out operation of the 2-bit response pattern plus 2-bit dummy pattern is started following the capture TCK bus cycle and continues until the next capture TCK bus cycle.

Figure 11C:
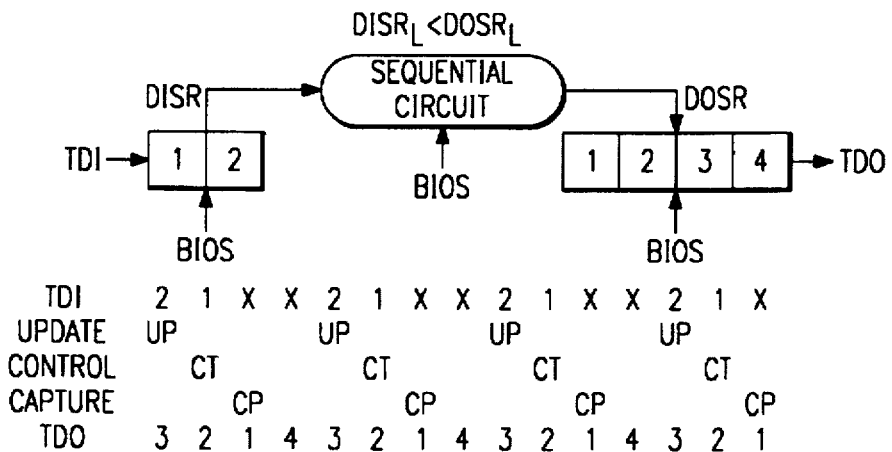

Case 3 is illustrated in FIG. 11c and occurs when the length of the DISR is less than the length of the DOSR. In FIG. 11c, the DISR is 2-bits in length and the DOSR is 4-bits in length. Testing is accomplished the same way as described in case 1 except that the BIOS additionally inputs control to the DISR to provide wait states during the shift in process. Testing of case 3 involves repeating the steps of; (1)

shifting a 2-bit test pattern from the test bus controller into the DISR, (2) suspending the shift in operation to the DISR for two wait states or TCK bus cycles, (3) updating the 2-bit test pattern and inputting it to the sequential circuit, (4) inputting control to the sequential circuit to allow the sequential circuit to respond to the 2-bit input pattern from the DISR and output a 4-bit response pattern to the DOSR, (5) capturing the 4-bit output response from the sequential circuit into the DOSR, and (6) shifting out the captured 4-bit response pattern to the test bus controller for processing.

The update control input to the DISR from the BIOS occurs during the TCK bus cycle following the second wait state. The control input to the sequential circuit from the BIOS occurs on the TCK bus cycle following the update TCK bus cycle. The capture control input to the DOSR from the BIOS occurs on the TCK bus cycle following the sequential control TCK bus cycle. The shift out operation of the 4-bit response pattern is started following the capture TCK bus cycle and continues until the next capture TCK bus cycle. By including two wait states, the data shifted into the DISR and data shifted out of the DOSR are made to appear to be the same length. The test bus controller inserts the two dummy bits (X) after the 2-bit input pattern so that the next input pattern will not be lost and will be available to be shifted into the DISR when shifting operations resume following the two wait states.

In the three cases for testing sequential circuits, the DOSR has been shown to be a parallel load, serial output type circuit. If desired, the DOSR can be made to operate as a parallel input signature analysis register (PSAR) to allow a signature to be taken of the parallel data as output from the sequential circuit, as shown in FIG. 11d. The use of PSARs as analysis registers for compacting test data is well known to those skilled in the art of testing.

If the DOSR is required to operate as a PSAR, the command register of the BIOS of FIG. 9 will be loaded with programming control to modify the DOSR of the selected DREG to operate as a PSAR. The programming control is input to the DOSR by control bus 126 via the control multiplexer 901 and programmable I/O controller bus 121. Also the DOSR will be loaded with a known seed or initial value prior to performing the test.

When the DOSR operates as a PSAR, the capture control input (CP) to the DOSR from the BIOS is applied following the control input (CT) as shown in FIG. 11d. With each capture input, a PSAR clock is generated in the PSAR to compress the parallel data received from the sequential circuit outputs in with the previous value in the PSAR.

When operating as a PSAR, the DOSR does not shift data out the TDO pin after the capture input. At the end of the test, the test bus controller will input an instruction to allow the test signature to be shifted out of the DOSR via the TDO output for inspection.

One benefit of using the DOSR as a PSAR instead of a parallel input/serial output register is that the shift out operation is not required, and the task of the test bus controller is reduced to only having to input serial data to the circuit under test via the DISR. Another very important benefit of operating the DOSR as a PSAR is that it eliminates the need for wait states to be added into the input test pattern bit stream to the DISR for case 3 (DISR1<DOSR1) in FIG. 11c. The wait states can be removed because the DOSR does not shift data out, thus the input wait states are not required and the first bit of the next input test pattern bit stream can be input to the DISR immediately following the last bit of the previous input test pattern bit stream. Eliminating the wait states reduces the test time for case 3 type sequential circuits.

Since the BIOS outputs capture control to the DOSR one TCK bus cycle after it completes the sequential control output, the propagation delay response time of the sequential circuit to the control and input stimulus can be tested by suitably adjusting the frequency of the TCK.

In sequential circuit testing, if the number of TCK bus cycles required for the control input equals or exceeds the number of TCK bus cycles required to shift data into the DISR, or out of the DOSR, the BIOS implements one or more states. In FIG. 11e, the BIOS is associated with a 2-bit DISR and a 2-bit DOSR which supply test input to and receive test output from a sequential circuit. The sequential circuit receives a control input sequence of three control signals CT1, CT2 and CT3, which control input sequence requires three TCK bus cycles. Because only two TCK bus cycles are needed to shift data into the 2-bit DISR, the BIOS must implement wait states to allow time for the 3-cycle control sequence. The update cycle of FIG. 11e is followed by the 3-cycle control sequence, which is followed in turn by the capture cycle. On the next TCK cycle following the capture cycle, the next update cycle occurs, and the captured data begins shifting out of the DOSR. As shown in FIG. 11e, three wait states (X) are inserted to accommodate the control sequence.

The number of wait states required to accommodate the control sequence can be reduced if it is known that the output of the sequential circuit under test will not change until after the control sequence is applied, even if new input data is updated from the DISR to the input of the sequential circuit. In such case, as shown in FIG. 11f, the update cycle and the capture cycle can be performed simultaneously so that only two wait states are required instead of three as in FIG. 11e.

Figure 12:
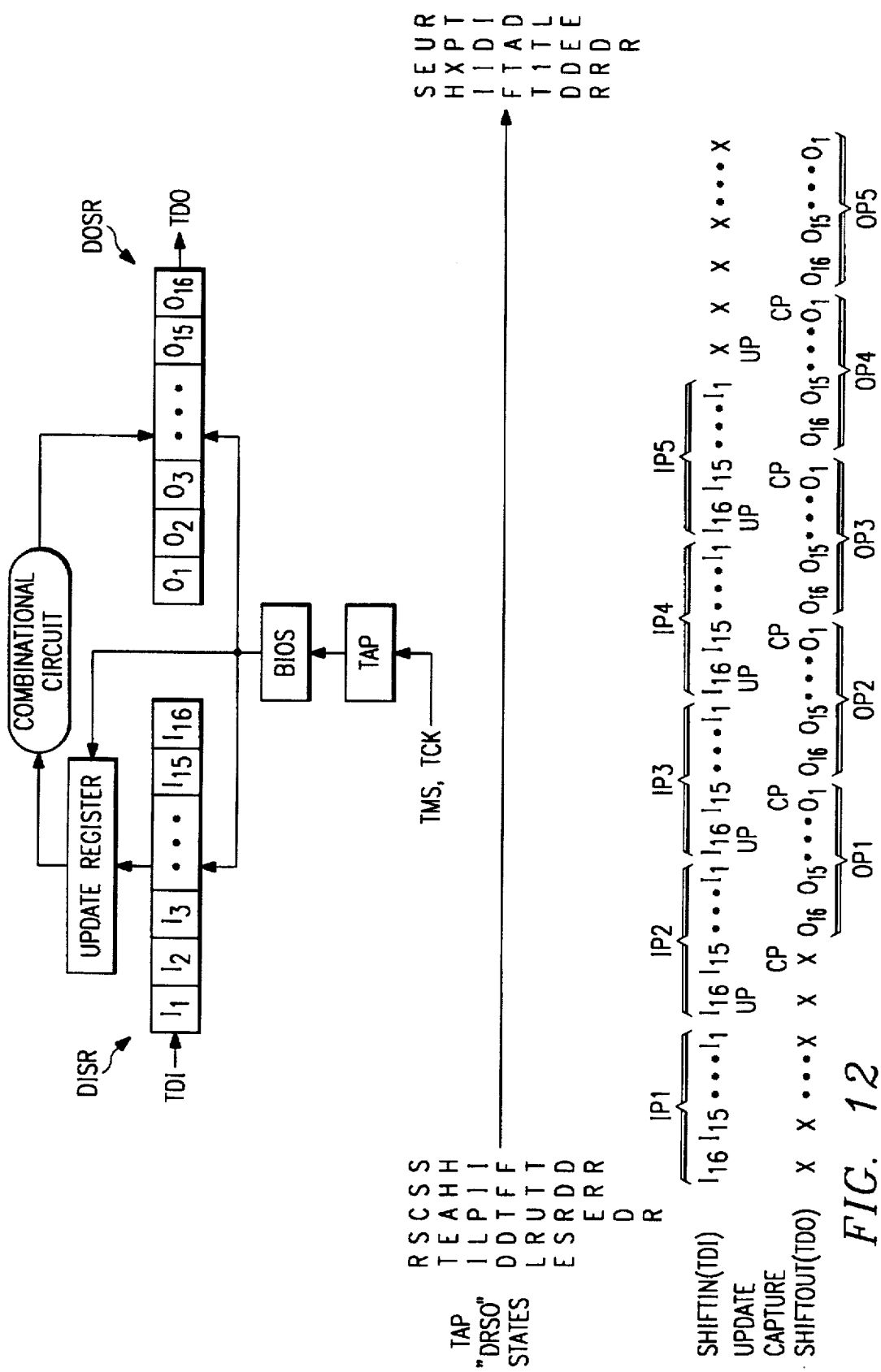

FIG. 12 shows a detailed view of the BIOS coupled between a DREG and the 1149.1 TAP. The DREG includes a 16-bit DISR providing input data to the combinational circuit and a 16-bit DOSR receiving data from the combinational circuit. When enabled, the BIOS receives synchronization and control input from the TAP and outputs control to the DREG. The control input to the DISR from the BIOS causes the DISR to shift in serial data from the TDI input into the shift register section and to cause the data in the shift register section to be parallel loaded or updated into the update register to be applied to the combinational circuit inputs. The control input to the DOSR from the BIOS causes the DOSR to capture parallel data output from the combinational circuit and shift the captured data out via the TDO output.

To initiate a test operation on the combinational circuit, the test bus controller programs the BIOS. This programming includes executing a data register scan operation to load the shift registers of FIG. 9, and thereafter scanning an instruction into the IREG to enable the programmable I/O controller. After the BIOS has been programmed, the test bus controller inputs control to the TAP to perform a data register scan operation. To aid in the description of how the BIOS and TAP operate together during combinational circuit testing, an operation flow of the test is shown in FIG. 12. The top flow is the TAP state movement during a data register scan operation (see FIG. 2) and the bottom flow illustrates the actions performed by the BIOS on the DREG in response to the TAP data register scan states.

Figure 1:
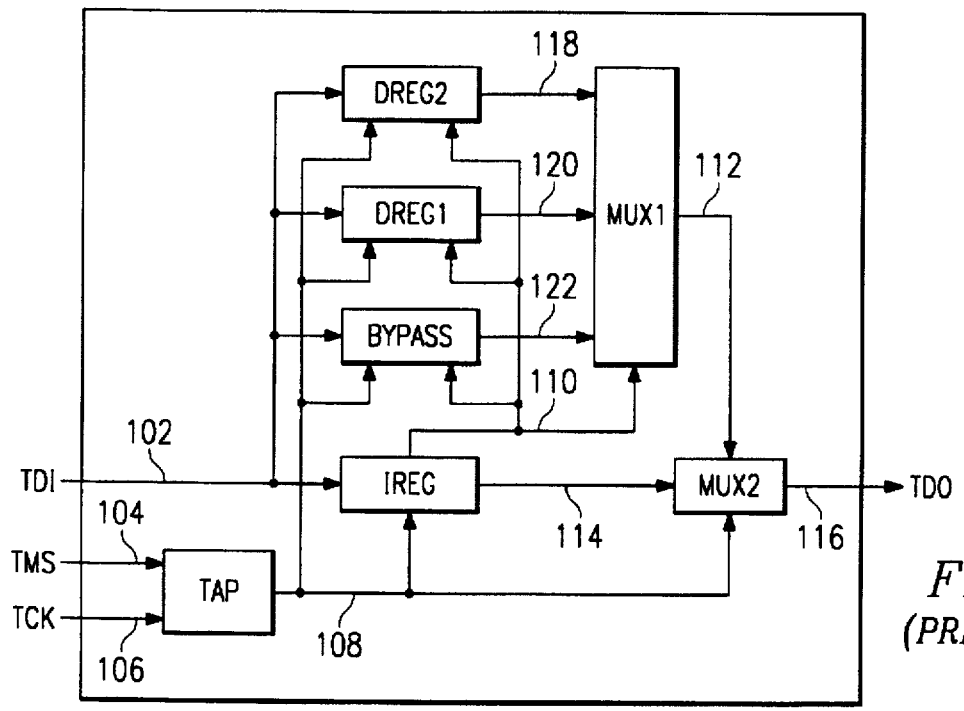
Figure 2:
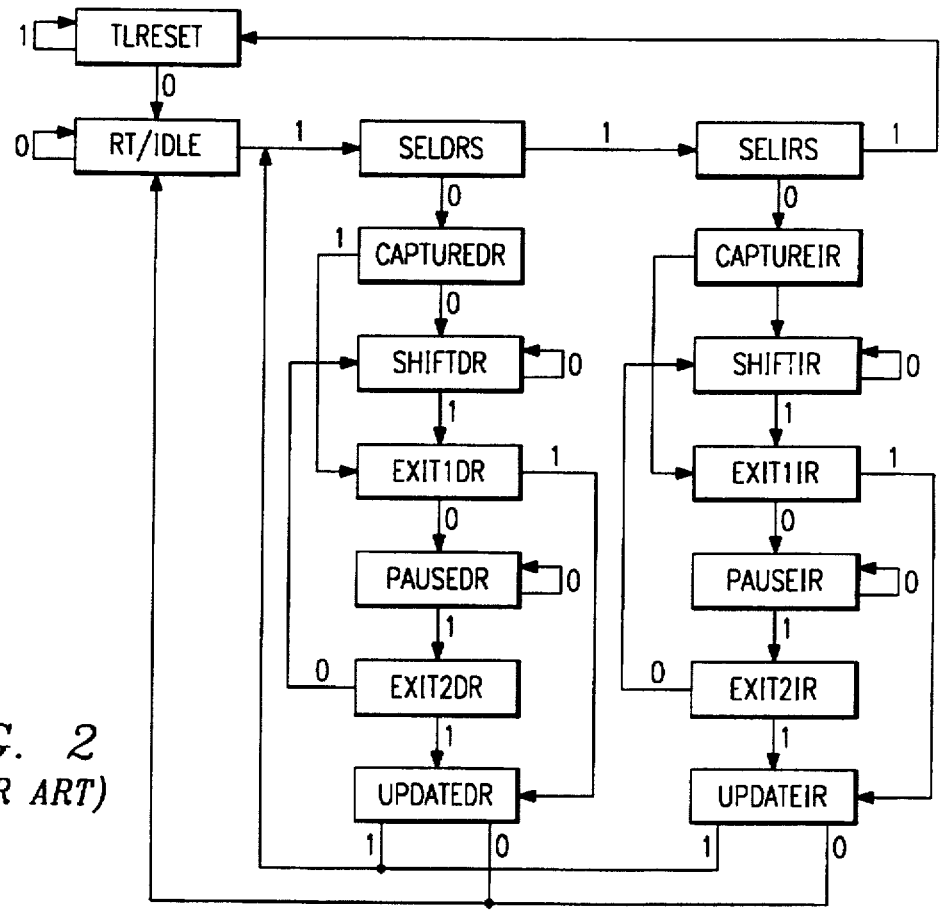

To start a data register scan operation (DRSO), the test bus controller causes the TAP to enter the SHIFTDR state, for example, by transitioning from RT/IDLE to SELDRS to CAPTUREDR to SHIFTDR (see FIG. 2). When the TAP enters the SHIFTDR state, the BIOS begins outputting control to the DISR to start shifting in data from the TDI input, assuming it also receives a startcc signal to signal the BIOS to start the test. After the first 16-bit input pattern (IP1) has been shifted into the shift register section of the DISR, the BIOS outputs control to parallel load or update (UP) the data into the update register to be input to the combinational circuit. The action of updating the parallel data does not interfere with the shift in operation of the next 16-bit input pattern (IP2).

After the parallel data is updated and input to the combinational circuit, the BIOS outputs control to cause the DOSR to capture (CP) the first 16-bit parallel output pattern (OP1) response from the combinational circuit. After the output pattern response is captured the BIOS outputs control to start shifting out the captured data from the DOSR via the TDO output. While the first 16-bit output pattern (OP1) is being shifted out, the second 16-bit input pattern (IP2) is being shifted in and updated into the DISR. When the first 16-bit output pattern (OP1) has been shifted out, the BIOS outputs control to cause the DOSR to capture the second 16-bit output pattern (OP2) from the combinational circuit and continue the shift out process. The action of capturing the next 16-bit output pattern does not interfere with the shift out operation of the DOSR.

As can be seen from the above description, the BIOS modifies the operation of the DISR and DOSR from the way they operate during conventional 1149.1 TAP data register scan operations. The BIOS outputs control to cause the DISR to repeat the steps of (1) shifting in a predetermined number of serial bits from the test bus controller via the TDI input then (2) updating the shifted in pattern into the update register, after the predetermined number of serial bits have been received, to be input to the combinational circuit inputs without interfering with the acceptance of the next packet of serial input bits from the test bus controller. The BIOS outputs control to the cause the DOSR to repeat the steps of (1) parallel capture of the output response data from the combinational circuit then (2) shifting out a predetermined number of serial bits of the captured response data to the test bus controller via the TDO output. The step of capturing response data does not interfere with the shift out operation. The BIOS orchestrates the serial input and parallel output steps of the DISR with the parallel capture and serial output steps of the DOSR so they occur at regular and predefined intervals during the test.

After the last input pattern (IP5) has been shifted in and updated into the DISR, the test bus controller will continue the data register scan operation for a predetermined amount of time to allow the last output pattern (OP5) to be captured and shifted out of the DOSR. When the BIOS senses that the last output pattern (OP5) has been captured into the DOSR (i.e.,when the tpccc signal is received), it inhibits further serial input to the DISR and further update and capture steps. At the end of the test operation the test bus controller terminates the data register scan operation by transitioning the TAP from the SHIFTDR state to the EXIT1DR state to shift out the last bit (O1) of the last output pattern (OP5), then transitions into the RT/IDLE state via the UPDATEDR state.

While not shown in FIG. 12, if the TAP had transitioned from the SHIFTDR state to the PAUSEDR state via the EXIT1DR state, the shifting of test data into and out of the DREG would have been temporarily suspended while the TAP is in the PAUSEDR state. The shifting of data into and out of the DREG would be resumed if the TAP transitioned back into the SHIFTDR state from the PAUSEDR state via the EXIT2DR state (see diagram in FIG. 2).

A clear advantage in using the BIOS instead of the TAP to control testing combinational circuits is that the test bus controller only needs to continuously transmit serial test data to the IC's TDI input to fill the DISR and only needs to receive serial test data from the IC's TDO output to empty the DOSR. The BIOS autonomously controls the update and capture test operations.

In conventional testing of a combinational circuit using the 1149.1 TAP and multiple data register scan operations, the test bus controller was required to take time out from shifting data into and out of the DREG, at regular intervals, to transition through multiple states to update the input data (SHIFTDR to EXIT1DR to UPDATEDR) and again to capture the output data (UPDATEDR to SELDRS to CAPTUREDR to SHIFTDR) from the combinational circuit.

In addition, in conventional testing, each TAP data register scan operation has to shift data through the entire length of the DISR and DOSR for each test pattern input to and output from the combinational circuit, increasing the test access time even further.

Equation 11 represents the number of TCK bus cycles the TAP must remain in the SHIFTDR state to allow the BIOS to input the number of input patterns (IPs) to completely test the combinational circuit, and equation 12 represents the required test time. For the sake of simplifying the examples, the other intermediate states the TAP transitions through to start and stop the data register scan operation are not used in equations 11 since they are only entered once during the test (i.e. SELDRS, CAPTUREDR, EXIT1DR, UPDATEDR, and RT/IDLE).

# of TCKs in SHIFTDR state=IP×2$^I$      Eq11

Where:

I=the # of bits in the input pattern (IP)

IP=I=bit width of input pattern

Test Time=(Eq11)×(1/TCKfreq      Eq12

To establish a combinational test time calculation benchmark for the single IC test environment using the BIOS, the same assumptions are used that were used above for the conventional combinational circuit test using multiple TAP data register scan operations, i.e. I=16 and the TCK frequency=10 Mhz. The calculated test time to test the combinational circuit is:

Test Time=(16×2$^{16}$)×(1/10 Mhz)=104.9 ms.

Assuming the IC contains the same number of similar combinational circuits to be tested by the BIOS as were tested by the conventional TAP controlled combinational circuit test, the test time for the BIOS to test 100 combinational circuits would be equal to 100×104.9 ms or 10.49 seconds.

Figure 13:
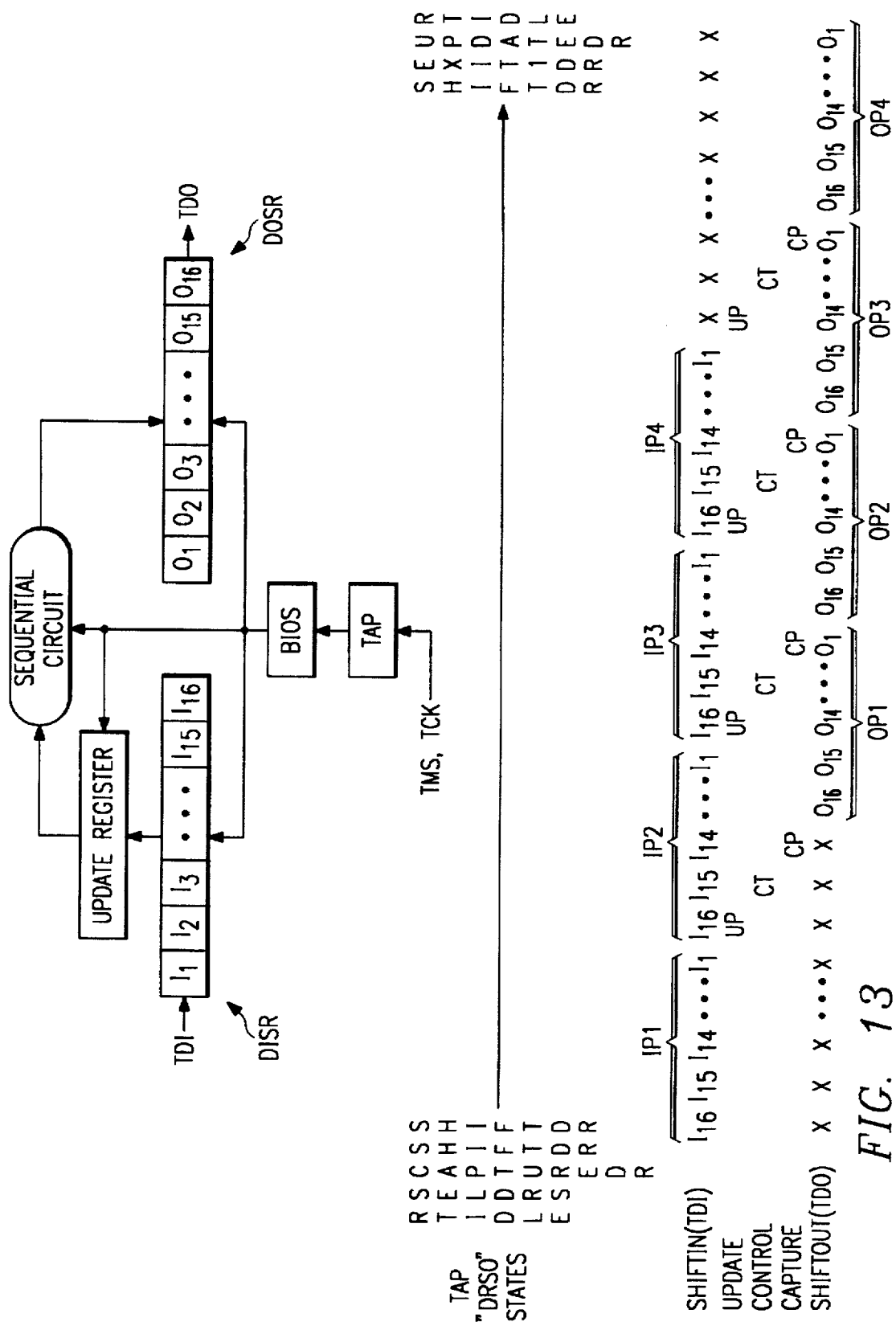

FIG. 13 shows a detailed view of the BIOS coupled between a DREG and the 1149.1 TAP. The DREG includes a 16-bit DISR providing input data to the sequential circuit and a 16-bit DOSR receiving data from the sequential circuit. When enabled, the BIOS receives synchronization and control input from the TAP and outputs control to the DREG. The control input to the DISR from the BIOS causes the DISR to shift in serial data from the TDI input into the shift register section and to cause the data in the shift register section to be parallel loaded or updated into the update register to be applied to the sequential circuit inputs. The control input to the sequential circuit from the BIOS causes the sequential circuit to respond to the input data from the DISR and output response data to the DOSR. The control input to the DOSR from the BIOS causes the DOSR to capture parallel data output from the sequential circuit and shift the captured data out via the TDO output.

To initiate a test operation on the sequential circuit, the test bus controller programs the BIOS via a data register scan operation. After the BIOS has been programmed, the test bus controller inputs control to the TAP to perform a data register scan operation. To aid in the description of how the BIOS and TAP operate together during sequential circuit testing, an operation flow of the test is shown in FIG. 13. The top flow is the TAP state movement during a data register scan operation (see FIG. 2) and the bottom flow illustrates the actions performed by the BIOS on the DREG in response to the TAP data register scan states.

To start a data register scan operation (DRSO), the TAP transitions from the RT/IDLE state into the SELDRS state, then into the CAPTUREDR state and finally into the SHIFTDR state. When the TAP enters the SHIFTDR state the BIOS begins outputting control to the DISR to start shifting in data from the TDI input, assuming it also receives a startcc signal to signal the BIOS to start the test. After the first 16-bit input pattern (IP1) has been shifted into the shift register section of the DISR, the BIOS outputs control to parallel load or update (UP) the data into the update register to be input to the sequential circuit. The action of updating the parallel data does not interfere with the shift in operation of the next 16-bit input pattern (IP2).

After the parallel data is updated and input to the sequential circuit, the BIOS outputs control (CT) to the sequential circuit to process the 16-bit input pattern and output a 16-bit output pattern in response. After the sequential control input has been applied to the sequential circuit, the BIOS outputs control to cause the DOSR to capture (CP) the first 16-bit parallel output pattern (OP1) response from the sequential circuit. After the output pattern response is captured the BIOS outputs control to start shifting out the captured data from the DOSR via the TDO output. While the first 16-bit output pattern (OP1) is being shifted out, the second 16-bit input pattern (IP2) is being shifted in and updated into the DISR. After the second input pattern is updated and input to the sequential circuit, the BIOS outputs sequential control to cause the sequential circuit to process the second input pattern and output the second output pattern. When the first 16-bit output pattern (OP1) has been shifted out, the BIOS outputs control to cause the DOSR to capture the second 16-bit output pattern (OP2) from the sequential circuit and continue the shift out process.

The sequential control is input to the sequential circuit while the input and output patterns are being shifted, so it does not interfere with either shift operation. Also the action of capturing the next 16-bit output pattern does not interfere with the shift out operation of the DOSR.

As can be seen from the above description, the BIOS modifies the operation of the DISR and DOSR from the way they operate during conventional 1149.1 data register scan operations. The BIOS outputs control to cause the DISR to repeat the steps of (1) shifting in a predetermined number of serial bits from the test bus controller via the TDI input then (2) updating the shifted in pattern into the update register, after the predetermined number of serial bits have been received, to be input to the sequential circuit inputs without interfering with the acceptance of the next packet of serial input bits from the test bus controller. After the DISR inputs the input pattern to the sequential circuit, the BIOS outputs control to cause the sequential circuit to react to the input pattern and output an output pattern. After the sequential control has been applied, the BIOS outputs control to the DOSR to cause the DOSR to repeat the steps of (1) parallel capture of the output response data from the sequential circuit then (2) shifting out a predetermined number of serial bits of the captured response data to the test bus controller via the TDO output. The BIOS orchestrates the serial input and parallel output steps of the DISR with the sequential control step and parallel capture and serial output steps of the DOSR so they occur at regular and predefined intervals during the test.

After the last input pattern (IP4) has been shifted in and updated into the DISR and sequential control has been applied to the sequential circuit, the test bus controller will continue the data register scan operation for a predetermined amount of time to allow the last output pattern (OP4) to be captured and shifted out of the DOSR. When the BIOS senses that the last output pattern (OP4) has been captured into the DOSR, it inhibits further serial input to the DISR and further update, sequential control, and capture steps. At the end of the test operation the test bus controller terminates the data register scan operation by transitioning the TAP from the SHIFTDR state to the EXIT1DR state to shift out the last bit (O1) of the last output pattern (OP4), then transitions into the RT/IDLE state via the UPDATEDR state.

While not shown in FIG. 13, if the TAP had transitioned from the SHIFTDR state to the PAUSEDR state via the EXIT1DR state, the shifting of test data into and out of the DREG and the application of sequential control to the sequential circuit would have been temporarily suspended while the TAP is in the PAUSEDR state. The shifting of data and application of sequential control would be resumed if the TAP transitions back into the SHIFTDR state from the PAUSEDR state via the EXIT2DR state (see diagram in FIG. 2).

A clear advantage in using the BIOS instead of the TAP to control testing of sequential circuits is that the test bus controller only needs to continuously transmit serial test data to the IC's TDI input to fill the DISR and only needs to receive serial test data from the IC's TDO output to empty the DOSR. All other test operations, update, capture, and most importantly the application of control input to the sequential circuit, are handled by the BIOS. The most obvious advantage of the BIOS over the TAP when testing sequential circuits is that the BIOS automatically generates and applies control input to the sequential circuit in the background while the input and output patterns are being shifted in and out of the DISR and DOSR, respectively. Thus no test time is added to generate and apply control input to the sequential circuit.

On the other hand, testing the sequential circuit using the conventional 1149.1 TAP and multiple data register scan operations, required the test bus controller to take time out from shifting data into and out of the DREG, at regular intervals, to transition through multiple states to update the input data (SHIFTDR to EXIT1DR to UPDATEDR) and again to capture the output data (UPDATEDR to SELDRS to CAPTUREDR to SHIFTDR) from the sequential circuit.

Also, each conventional TAP data register scan operation has to shift data through the entire length of the DISR. CISR and DOSR for each test pattern input to and output from the sequential circuit, increasing the test access time even further. The most noticeable disadvantage of the conventional 1149.1 TAP testing of sequential circuits is that it has to add at least two entire data register scan operations per test pattern applied to generate the control input to the sequential circuit, which significantly increases test time.

Equation 11 represents the number of TCK bus cycles the TAP must remain in the SHIFTDR state to allow the BIOS to input the number of input patterns (IPs) to completely test the sequential circuit, equation 12 represents the required test time. Equations 11 and 12 of the combinational circuit test time calculations can be used for the sequential circuit test time calculations because the control inputs to the sequential circuit are generated during the shift in operation, whereby no additional time is seen in the test time calculation.

$$\text{\# of } TCKs \text{ in SHIFTDR state} = I P \times 2^I \qquad \text{Eq11}$$

Where:

I=the # of bits in the input pattern (IP)
IP=I=bit width of input pattern $$\text{Test Time} = (\text{Eq11}) \times (1/TCKfreq) \qquad \text{Eq12}$$

To establish a sequential test time calculation benchmark for the single IC test environment using the BIOS, the same assumptions are used that were used above for the conventional sequential test time using multiple TAP data register scan operations, i.e. I=16 and the TCK frequency=10 Mhz. The calculated test time to test the sequential circuit using the BIOS is:

$$\text{Test Time} = (16 \times 2^{16}) \times (1/10 \text{ Mhz}) = 104.9 \text{ ms} \qquad \text{Eq12}$$

A gain assuming the IC contains the same number of similar sequential circuits to be tested as the conventional 1149.1 TAP controlled sequential test, the test time to test 100 sequential circuits in the IC using the BIOS would be equal to 10.49 seconds.

To illustrate the benefit of using the BIOS over the conventional TAP control to test sequential circuits requiring multiple control input activations, the test time calculation for a sequential circuit being tested via the conventional 1149.1 TAP (Eq6) is repeated for a single control input that must be activated three times per test pattern applied to the sequential circuit. The conventional 1149.1 TAP test time calculation with 1 control bit (C) activated three times (K=3) per test pattern results in a test time of;

$$\text{Test Time} = (1+16+1+16+1) \times (2^{16} \times 7) \times (1/10 \text{ Mhz}) = 1.60 \text{ seconds} \qquad \text{Eq6}$$

Testing 100 sequential circuits would take 100×1.60 seconds or 160 seconds. Comparing the test time of 100 sequential circuits using the BIOS (10.49 seconds) to the test time of the same 100 sequential circuits using the conventional 1149.1 TAP operation (160 seconds) shows a test time reduction using the BIOS of 93.4%

The following example describes how a combinational circuit associated with an IC's DREG can be tested using the BIOS in the type of multiple IC environment shown in FIG. 7. Once again, the combinational circuit could be a subcircuit in the IC or the entire IC. The middle IC of FIG. 7, referred to as the target (T) in the group, would contain the DREG, combinational circuit, BIOS, and TAP shown in FIG. 12. There are "N" ICs between the target IC's TDI input and the test bus controller's TDO output and "M" ICs between the target IC's TDO output and the test bus controller's TDI input.

When testing starts, the TAP, BIOS, DISR, and DOSR operate to test the combinational circuit the same way as described in the single IC environment. The only difference between the multiple and single IC combinational test environment using the BIOS is the length of the scan path between the test bus controller and the target IC.

Prior to testing, the test bus controller inputs test commands into the ICs of FIG. 7 to select the Bypass registers of ICs 1-N and 1-M, and to enable the BIOS in the target IC for testing the combinational circuit. After the ICs are setup the test bus controller outputs control to cause the TAPs of the ICs to perform a data register scan operation. The BIOS in the target IC will delay starting the test until the startcnt counter has counted N TCK bus cycles to allow the test data to arrive at the target IC via ICs 1-N. Once the test starts it operates exactly as described in the BIOS testing of combinational circuits in a single IC env ironment.

Equation 13 represents the number of TCK bus cycles the TAP must remain in the SHIFTDR state to allow the BIOS to input the number of input patterns (IPs) to completely test the combinational circuit, plus an initial N TCK bus cycles to shift the first test data from the test bus controller, through N ICs, to the target ICs input, plus an ending M TCK bus cycles to shift the last test data from the target IC, through M ICs, to the test bus controller. Equation 14 represents the required test time. This example assumes 500 ICs for N and 500 ICs for M.

$$\text{\# of } TCKs \text{ in Test} = N + I \times 2^I + M \qquad \text{Eq13}$$

Where:

I=the # of bits in the input pattern (IP)
N=the # of ICs between test controller and target IC
M=the # of ICs between target IC and test controller
N=M=500

$$\text{Test Time} = (\text{Eq13}) \times (1/TCKfreq) \qquad \text{Eq14}$$

To establish a test time calculation benchmark for the multiple IC test environment using the BIOS to test the combinational circuit of the target IC, assume a TCK frequency of 10 Mhz. The calculated test time to test the combinational circuit is:

$$\text{Test Time} = (500 + 16 \times 2^{16} + 500) \times (1/10 \text{ mhz}) = 104.8 \text{ ms} \qquad \text{Eq14}$$

As stated in the single IC test environment, the complete testing of the IC may require repeating this test on 100 similar combinational circuits. Testing 100 combinational circuits in the target IC would take 100×104.8 ms or 10.48 seconds. Testing 1000 ICs of similar complexity would take 1000×10.48 seconds or 10,480 seconds or 174.8 minutes or 2.9 hours.

The following example describes how a sequential circuit associated with an IC's DREG can be tested using the BIOS in the type of multiple IC environment shown in FIG. 7. Once again, the sequential circuit could be a subcircuit in the IC or the entire IC. The middle IC of FIG. 7, referred to as the target (T) in the group, would contain the DREG, sequential circuit, BIOS, and TAP shown in FIG. 12. There are "N" ICs between the target IC's TDI input and the test bus controller's TDO output and "M" ICs between the target IC's TDO output and the test bus controller's TDI input.

When testing starts, the TAP, BIOS, DISR, and DOSR operate to test the sequential circuit the same way as described in the single IC environment. The only difference between the multiple and single IC sequential test environment using the BIOS is the length of the scan path between the test bus controller and the target IC.

Prior to testing, the test bus controller inputs test commands into the ICs of FIG. 7 to select the Bypass registers of ICs 1-N and 1-M, and to enable the BIOS in the target IC for testing the sequential circuit. After the ICs are setup the test bus controller outputs control to cause the TAPs of the ICs to perform a data register scan operation. The BIOS in the target IC will delay starting the test until the startcnt counter has counted N TCK bus cycles to allow the test data to arrive at the target IC via ICs 1-N. Once the test starts it operates exactly as described in the BIOS testing of sequential circuits in a single IC environment.

Equation 13 represents the number of TCK bus cycles the TAP must remain in the SHIFTDR state to allow the BIOS to input the number of input patterns (IPs) to completely test the sequential circuit, plus an initial N TCK bus cycles to shift the first test data from the test bus controller, through N ICs, to the target IC input, plus an ending M TCK bus cycles to shift the last test data from the target IC, through M ICs, to the test bus controller. Equation 14 represents the required test time. This example assumes 500 IC for N and 500 ICs for M. Equations 13 and 14 of the combinational circuit test time calculations can be used for the sequential circuit test time calculations because the control input to the sequential circuit is performed by the BIOS during the shift in operation, and therefore it is not seen in the test time calculation.

$$\text{\# of } TCKs \text{ in Test}=N+I\times2^I+M \qquad \text{Eq13}$$

Where:

I=the # of bits in the input pattern (IP)

N=the # of bits between test controller and target IC

M=the # of bits between target IC and test controller

N=M=500

$$\text{Test Time}=(\text{Eq13})\times(1/TCK\text{freq}) \qquad \text{Eq14}$$

To establish a test time calculation benchmark for the multiple IC test environment using the BIOS to test the sequential circuit of the target IC, assume a TCK frequency of 10 Mhz. The calculated test time to test the sequential circuit is:

$$\text{Test Time}=(500+16\times2^{16}+500)\times(1/10 \text{ mhz})=104.8 \text{ ms} \qquad \text{Eq14}$$

As stated in the single IC test environment, the complete testing of the IC may require repeating this test on 100 similar sequential circuits. Testing 100 sequential circuits in the target IC would take 100×104.8 ms or 10.48 seconds. Testing 1000 ICs of similar complexity would take 1000× 10.48 seconds or 10,480 seconds or 174.8 minutes or 2.91 hours.

Figure 14A:
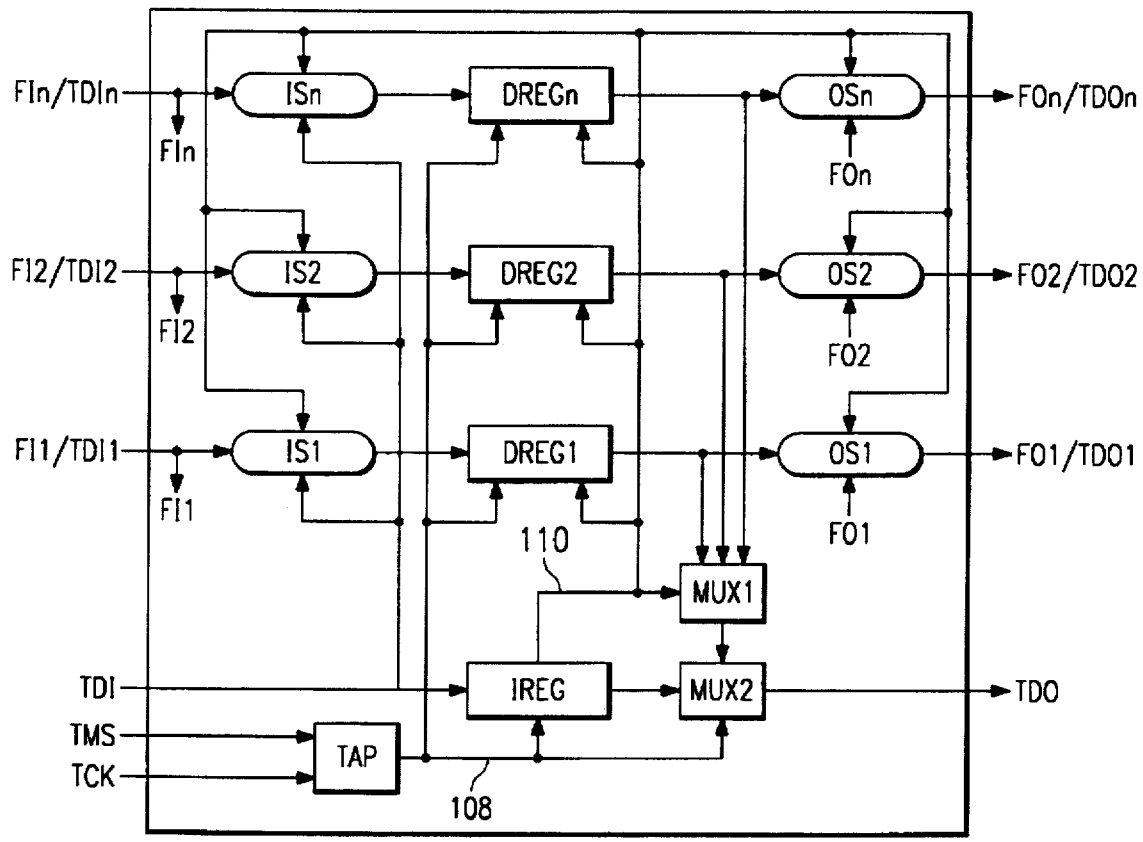
FIG. 14A is a block diagram which illustrates a serial scan test architecture capable of testing a plurality of electrical circuits concurrently.

FIG. 14A illustrates a parallel test architecture for allowing each DREG's TDI input and TDO output to be coupled to an external tester or test bus controller so that serial input and output operations can be applied to multiple DREGs in parallel during each TAP data register scan operation. This parallel architecture, using multiple TDI/TDO pairs to access multiple DREGs enables simultaneous testing of all the circuits in the IC using a single TAP controller and multiple data register scan operations like those described above in connection with the conventional 1149.1 test operation. Since all tests occur in parallel, the test time required to test all the circuits in the IC is reduced and is equal to the time it takes to test the circuit with the longest test pattern application sequence.

The parallel architecture in FIG. 14A includes electronic input and output switches or multiplexers on each DREG's TDI input and TDO output. The input switches (IS1-n) receive the TDI input from the test bus, an input from a function pin of the IC (labeled as FI1-n/TDI1-n), and selection control input from the instruction register control bus 110. The output switches (OS1-n) receive the TDO output from a related DREG 1-n, a connection to a functional output signal (FO1-n) that is normally coupled to the related function pin (labeled as FO1-n/TDO1-n) when testing is not being performed, and selection control input from the instruction register control bus 110. The output from the output switches are coupled to a functional pin (FO1-n/ TDO1-n) of the IC.

In FIG. 14A, when no testing is being performed, that is, during functional operation, the input pins FI1-n/TDI1-n become functional inputs to the IC logic circuitry and the output pins FO1-n/TDO1-n become functional outputs from the IC logic circuitry. The signals FI1-n input to the FI1-n/ TDI1-n input pins go to the input switches and to predefined functional inputs of the IC's logic circuitry. Also during functional operation, the signals FO1-n output from the ICs logic circuitry pass through the output switches OS1-n to be output on the FO1-n/TDO1-n output pins.

During test operation, the signals input on the FI1-n/ TDI1-n input pins are coupled by the input switches IS1-n to the serial inputs of the DREGs. Also during test operation, the output switches OS1-n couple the serial outputs from the DREGs to the FO1-n/TDO1-n pins in place of the normal functional output signals FO1-n from the IC's logic circuitry.

While the IC is in test mode, its logic circuitry does not respond to the FI1-n inputs from the FI1-n/TDI1-n input pins as it normally does when the IC is in functional mode. Methods of preventing the IC's logic circuitry from responding to the FI1-n inputs while the IC is in test mode include; (1) gating each signal (FI1-n) to force it to output a constant logic level to the IC's logic circuitry during test, (2) inhibiting the IC's functional clock so that the logic circuitry is not clocked during test mode, forcing it to remain in a predetermined, static state, or (3) designing the IC's logic circuitry in any suitable manner that allows it to be disabled from responding to the input signals FI1-n while the IC is in test mode.

Figure 14B:
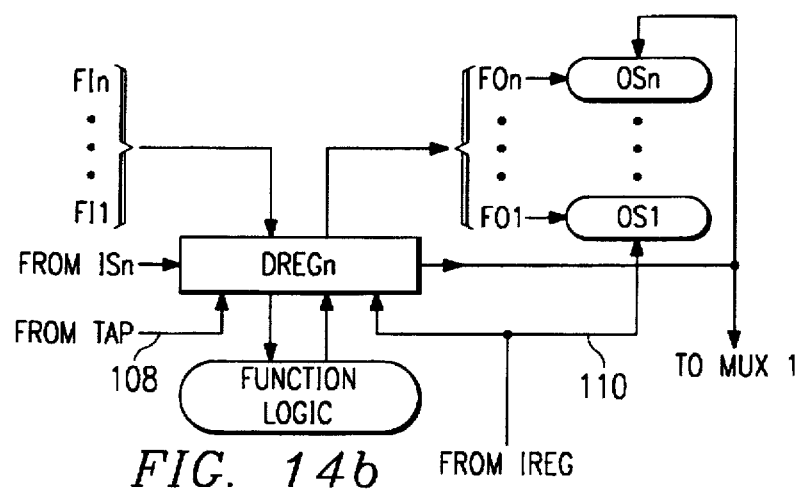
FIG. 14B illustrates a modification of the test architecture of FIG. 14A.

Referring now to FIGS. 14A and 14B, an exemplary modification of the FIG. 14A test architecture is illustrated in FIG. 14B. A DREG of FIG. 14A, in this example DREGn, is configured in FIG. 14B as a boundary scan register of the type described in the IEEE 1149.1 STD entitled "A Test Access Port and Boundary Scan Architecture". In the arrangement of FIG. 14B, DREGn receives the FI1-FIn signals from input pins FI1/TDI1–FIn/TDIn, and provides these signals at the inputs of the IC's function logic. DREGn also receives the FO1–FOn signals output from the IC's function logic, and provides these signals to output switches OS1–OSn. As indicated above, the IREG can assert control via bus 110 such that: the FO1–FOn signals are passed through the output switches OS1–OSn to the output pins FO1/TDO1–FOn/TDOn; the serial input of DREGn is coupled to TDI via input switch ISn; and the serial output of DREGn is applied to MUX2 via MUX1. Under control of the TAP and bus 108, the serial output of DREGn can be passed through MUX2 to TDO. The FIG. 14B modification thus enables the test architecture of FIG. 14A to perform conventional boundary scan test operations in addition to the testing operations described above.

When parallel testing is to be performed on all the IC circuits using the parallel architecture of the present invention, the test interface requirement exceeds the 4 test signals required for the conventional 1149.1 interface shown in FIG. 4. In addition to the conventional 1149.1 test bus signals (TDI, TDO, TMS, and TCK), the tester for parallel testing requires a TDO output and a TDI input for each DREG in the IC.

Figure 15:
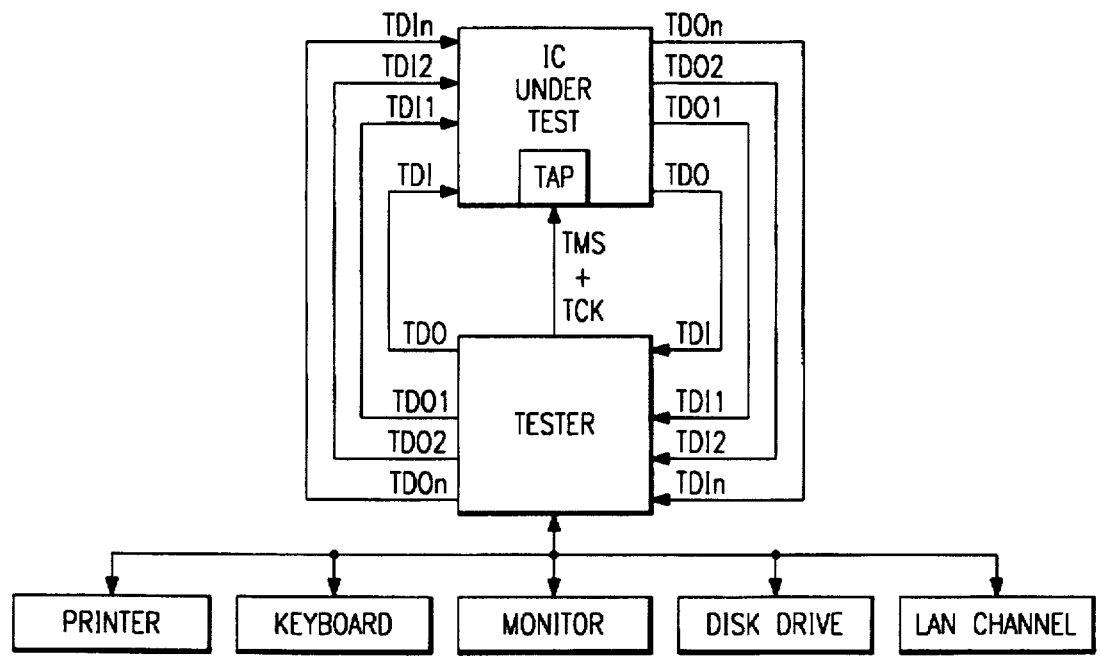

FIG. 15 illustrates a tester design for testing a single IC in the parallel test mode. The tester provides the four test bus signals required for the basic 1149.1 interface, plus TDO1-n output signals for each of the IC's TDI1-n input signals and TDI1-n inputs for each of the IC's TDO1-n output signals. The tester also has an interface to external peripherals such as printers, keyboards, monitors, disk drives, and Local Area Networking (LAN) channels.

To prepare for parallel testing of the IC, the tester inputs an instruction into the IREG via the 4-wire test bus, which instruction causes the input switches to couple the TDI1-n input pins up to the TDI inputs of DREGs 1-n, and causes the output switches to couple the TDO outputs of DREGs 1-n up to the TDO1-n output pins. Also the instruction enables DREGs 1-n to be selected for testing via multiple data register scan operations as described above.

During parallel testing of multiple combinational circuits, the individual tests can be performed as described above for the circuit of FIG. 5. During test the tester outputs control on the TMS and TCK control outputs to be input to the IC's TMS and TCK control inputs. In addition, the tester outputs serial data on its TDO1-n outputs to be input to the IC's TDI1-n input pins, and receives serial data on it's TDI1-n inputs from the IC's TDO1-n output pins.

In response to the control input from the tester, the TAP of the IC outputs internal control to the DREGs via bus 108 to allow the data input to the IC's TDI1-n pins to be shifted into the DISRs of each DREG, updated and input to the combinational circuit inputs during each data register scan operation. After the update operation, the TAP outputs control to the DREGs to cause their DOSRs to capture the output data from the combinational circuits and shift it out to the tester via the TDO1-n output pins. This process of shifting in and updating, followed by capturing and shifting out is repeated until all the combinational circuits have been completely tested. The testing of each individual combinational circuit can be identical to that previously described in connection with the single IC environment of FIG. 5. With the parallel test architecture of FIG. 14A, however, multiple DREGs are accessed to test multiple combinational circuits concurrently.

The test time for the parallel test is equal to the time it takes to test the combinational circuit with the longest test pattern application sequence. For example, if the IC has 100 combinational circuits being tested in parallel, and each has a DREG consisting of a DISR length of 16 bits and a DOSR length of 16 bits, the test time to test all 100 circuits in parallel with a TCK frequency of 10 Mhz can be calculated using equations 1, 2, and 3.

$$\text{\# of } TCKs/\text{scan operation} = (\text{Capture}DR) + (\text{Shift}DR) + (\text{Update}DR) \quad \text{Eq 1}$$
$$= (1) + (I + O) + (1)$$

Where: $I$ = the # of $DISR$ bits
$O$ = the # of $DOSR$ bits $$\text{\# of Scan Operations} = 2^I \ (I = \text{the \# of combinational data inputs}) \quad \text{Eq 2.}$$

$$\text{Parallel Test Time} = (\text{Eq1}) \times (\text{Eq2}) \times (1/TCK\text{freq}) \quad \text{Eq3.}$$

$$\text{Parallel test Time} = (1+16+16+1) \times (2^{16}) \times (1/10 \text{ Mhz}) = 222.8 \text{ ms} \quad \text{Eq3.}$$

Comparing the single IC environment test time of 100 similar combinational circuits using the parallel approach (222.8 ms) of the present invention with the single IC environment test time using the conventional 1149.1 approach (22.28 sec) results in a test time reduction of 99%.

During parallel testing of multiple sequential circuits, the individual tests can be performed as described above for the circuit of FIG. 6. During test the tester outputs control on the TMS and TCK control outputs to be input to the IC's TMS and TCK control inputs. In addition, the tester outputs serial data on its TDO1-n outputs to be input the IC's TDI1-n input pins, and receives serial data on it's TDI1-n inputs from the IC's TDO1-n output pins.

In response to the control input from the tester, the TAP of the IC outputs internal control to the DREGs via bus 108 to allow the data input to the IC's TDI1-n pins to be shifted into the DISR, CISR and DOSR of each DREG, updated and input to the sequential circuit inputs. After the tester repeats the shift in and update operation a predetermined number of times (i.e. enough times to cause the sequential circuit to react to the input pattern and output a response pattern as described above), the TAP outputs control to cause the DOSR to capture the output data from the sequential circuit and shift it out to the tester via the TDO1-n output pins.

This process of shifting in and updating for a predetermined number of times, followed by capturing and shifting out is repeated until all the sequential circuits have been completely tested. The testing of each individual sequential circuit can be identical to that previously described in connection with the single IC environment of FIG. 6. With the parallel test architecture of FIG. 14A, however, multiple DREGs are accessed to test multiple sequential circuits in parallel and simultaneously.

The test time for the parallel test is equal to the time it takes to test the sequential circuit with the longest test pattern application sequence. For example, if the IC has 100 sequential circuits being tested in parallel, and each has a DREG consisting of a DISR length of 16 bits, a CISR length of 1 bit (with three activations per test pattern), and a DOSR length of 16 bits, the test time to test all 100 circuits in parallel with a TCK frequency of 10 Mhz can be calculated using equations 4, 5, and 6.

$$\text{\# of } TCKs/\text{scan operation} = (\text{Capture}DR) + (\text{Shift}DR) + (\text{Update}DR) \quad \text{Eq 4.}$$
$$= (1 + I + C + O + 1)$$

Where: $I$ = the # of $DISR$ bits
$C$ = the # of $CISR$ bits
$O$ = the # of $DOSR$ bits $$\text{\# of Scan Operations} = 2^I \times (1 + 2K) \quad \text{Eq 5.}$$

Where: $I$ = the # of data inputs
$K$ = the # of control input activations $$\text{Test Time} = (\text{Eq4}) \times (\text{Eq5}) \times (1/TCK\text{freq}) \quad \text{Eq6.}$$

$$\text{Test Time} = (1+16+1+16+1) \times (2^{16} \times 7) \times (1/10 \text{ Mhz}) = 1.60 \text{ seconds} \quad \text{Eq6}$$

Comparing the single IC environment test time of 100 similar sequential circuits using the parallel approach (1.60 seconds) of the present invention with the test time using the conventional 1149.1 approach (100×1.60 sec=160 sec) results in a test time reduction of 99%.

The parallel test approach does not require that all the IC's DREGs be the same bit length. In practice, the DREG's of an IC may each be a different length. The DREG with the longest bit length sets the input and output scan frame bit length for all other DREGs during parallel testing. A scan frame is defined as the number of input and output bit positions that are shifted into and out of a DREG during test. The DREG with the longest number of input and output bit positions will have all of its bit positions utilized. A DREG with a lesser number of input and output bit positions will have added -dummy- bits inserted into its scan frame so that it will be the same bit length as the longest DREG scan frame. The -dummy- bits are inserted into shorter DREG scan frames at key bit positions to align the input and output bit positions of the scan frame with the bit positions of the input and output section of the DREG.

Figure 16:
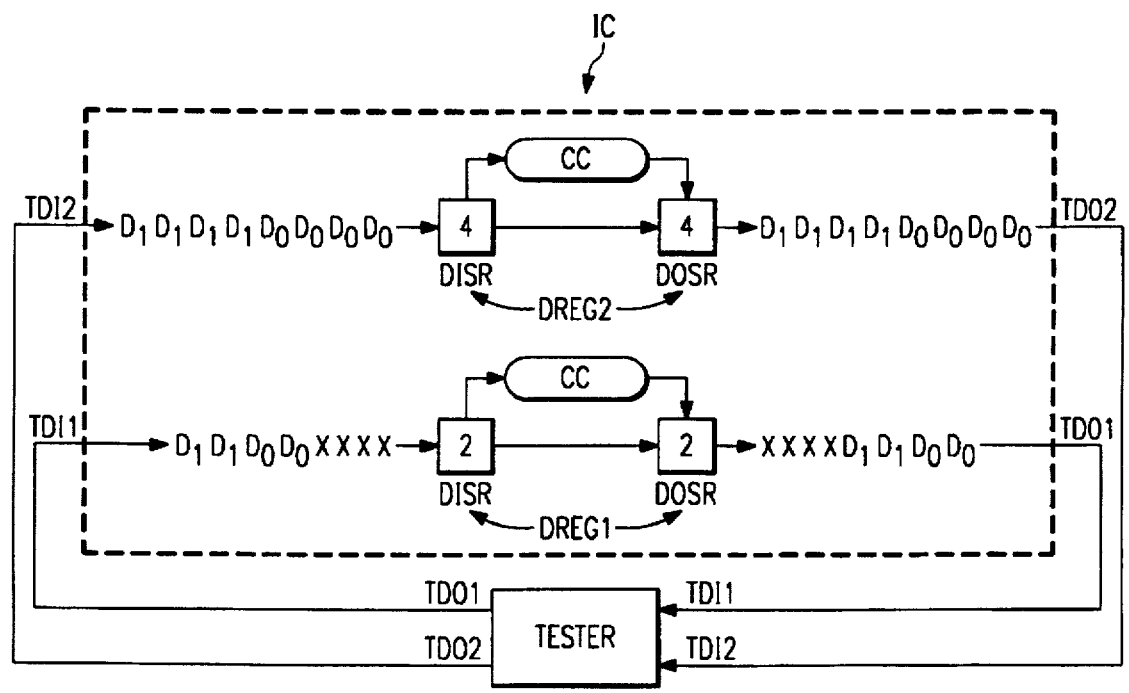

In FIG. 16 an IC is shown with two DREGs coupled to two combinational circuits (CC) to illustrate the scan framing scenario. DREG1 consists of a 2-bit DISR and a 2-bit DOSR, and DREG2 consists of 4-bit DISR and a 4-bit DOSR. DREG2 has a total of 8 bits and DREG1 has a total of 4 bits, so DREG2 sets the scan frame length for parallel testing to be 8 bits. During parallel testing, the tester simultaneously outputs 8-bit frames of serial test patterns to DREG1 and DREG2 and simultaneously receives 8-bit frames of test patterns from DREG1 and DREG2. Since the bit length of DREG1 is only 4 bits, the tester inserts 4 dummy bits (X) at the beginning of each 8-bit test pattern frame input to DREG 1. The 4 dummy bits are used to align the input of the actual test data bits up with the actual bit portions of the DISR and DOSR of DREG1. By inserting dummy bits into the scan input frame of DREG1, the tester balances the test pattern input frames of DREG1 and DREG2 to where they both can be shifted in and updated to the combinational circuits in parallel, effectuating the concurrent testing of both combinational circuits.

While the tester is outputting frames of serial test patterns into DREG1 and DREG2, it is also receiving frames of serial test patterns from DREG1 and DREG2. The tester can be programmed for outputting and receiving test frames in, for example, 8-bit lengths. Also the tester's program has a knowledge of the IC's DREG lengths, enabling it to insert the required number of dummy bit positions into scan frames to be input to each DREG in the IC and strip the same number of dummy bit positions when receiving scan frames back from each DREG in the IC. Since the bit length of DREG1 is only 4 bits, and the scan frame length is 8 bits, the tester accepts only the first 4 bits of the input scan frame and deletes the last 4 dummy bit positions. In this way the tester can more efficiently store and process the test output response from the parallel test, since only the true output bit positions of the DREGs are stored and processed by the tester.

While DREGs were shown testing combinational circuits in the scan framing scenario of FIG. 16, the same scenario holds for DREGs testing sequential circuits. The only difference is that the DREGs for sequential circuits contain a CISR register in addition to the DISR and DOSR registers as described above.

While the bit length of the longest DREG in an IC sets the scan frame bit length, it does not set the test time required for parallel testing multiple circuits associated with DREGs. In some cases a DREG with a lesser true bit length requires more test pattern sequences than a DREG with a greater true bit length, due to it having a greater number of bits in its DISR section. For example, a DREGx with a 4-bit DISR and 10-bit DOSR will be tested in less time than a DREGy with a 6-bit DISR, a 4-bit DOSR, and 4 dummy bits for alignment. The number of TCKs required to test DREGx is equal to 2 to 4th power times 14 bits or 224 TCKs. The number of TCKs required to test DREGy is equal to 2 to the 6th power times 14 bits or 896 TCKs.

If, during the parallel testing of multiple DREGs, some of the DREGs complete their test earlier than others, the tester will continue to input and output scan frames to the DREGs that have completed their testing until all other DREGs have completed their testing. The scan frames input and output to DREGs that have completed their tests can be don't care scan frame operations since these DREGs are just being cycled through additional scan frames until the other DREGs have completed their tests. However, the don't care scan frames should be chosen so as not to harm the circuit under test.

The above-described BIOS test mode of the present invention can be expanded to allow the testing of a plurality of circuits in an IC to be performed both autonomously and in parallel through the use of multiple BIOS circuits.

To achieve parallel BIOS testing of a plurality of circuits in an IC, a BIOS is coupled to each DREG in the IC to autonomously regulate testing of the combinational or sequential circuit associated with each DREG. In addition, each DREG's TDI input and TDO output is directly coupled to a tester by converting the IC's functional pins into test pins during the testing process, as described above in connection with FIG. 14A.

The parallel BIOS test architecture uses multiple BIOS circuits and scan paths to allow simultaneous testing of all the circuits associated with all the DREGs in the IC. Thus the test time for the IC is significantly reduced and is equal to the time it takes a BIOS to test the circuit coupled to the DREG with the longest test pattern application sequence.

The parallel BIOS test architecture uses a plurality of BIOS circuits in combination with the parallel test architecture of FIG. 14A to autonomously regulate the simultaneous testing of a plurality of circuits coupled to a plurality of DREGs.

Figure 17:
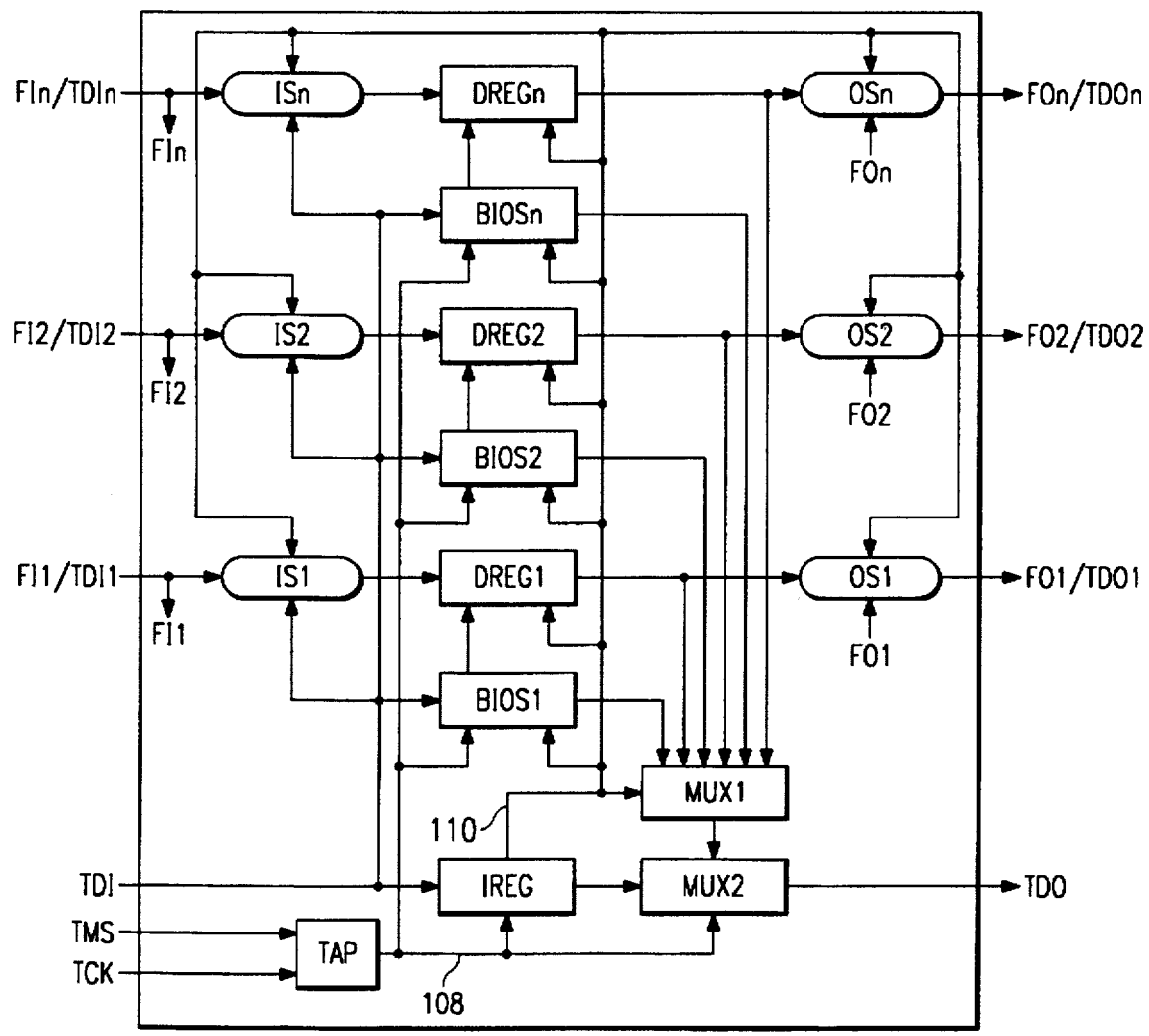

In FIG. 17, the parallel BIOS test architecture is illustrated. The parallel BIOS test architecture includes electronic input and output switches or multiplexers on each DREG's TDI input and TDO output. The input switches (IS1-n) receive the TDI input from the test bus, an input from a function pin of the IC (labeled as FI1-n/TDI1-n), and selection control input from the instruction register control bus 110. The output switches (OS1-n) receive the TDO output from an associated DREG 1-n, a connection to a functional output signal (F01-n) that is normally coupled to the related function pin (F01-n/TD01-n) when testing is not being performed, and selection control input from the instruction register control bus 110. The output switches output data to a functional pin (F01-n/TD01-n) of the IC. The input and output switches IS1-n and 0S1-n of FIG. 17 can thus be used in the manner described above with respect to FIGS. 14A–14B.

In addition, the parallel BIOS test architecture includes a BIOS circuit (BIOS1-n) coupled to each DREG (DREG1-n) in the IC. Each BIOS circuit is coupled to the TDI input and TDO output, via multiplexers MUX1 and MUX2, to allow programming data to be shifted into the BIOS circuits from the tester. Each BIOS receives the TAP control bus 108 and the instruction register control bus 110, in addition to the TDI input. Each BIOS outputs control to its associated DREG to regulate testing and output serial data to the TDO output. Each BIOS circuit can be implemented as shown in FIG. 9. Because each BIOS circuit is associated with only one circuit under test and only one DREG, the individual BIOS circuits may be customized if desired to eliminate some of the BIOS programming discussed above with respect to FIG. 9.

The parallel BIOS test architecture of FIG. 17 can be modified, in the manner described above relative to FIGS.

14A and 14B, so that one DREG of FIG. 17 is configured as a boundary scan register (FIG. 14B). With this modification, FIG. 17 can perform conventional boundary scan test operations in the manner described above relative to FIGS. 14A and 14B. Also, the architecture of FIG. 17 can operate in the parallel test mode of FIG. 14A when testing is being performed using the TAP to control parallel testing of multiple circuits via multiple DREGs. In addition, the architecture of FIG. 17 can operate in the single BIOS test mode of FIG. 8 when testing is being performed using a single BIOS and the TAP to control testing of a single circuit via a selected DREG.

However, when an instruction is shifted into the instruction register to configure the FIG. 17 architecture for parallel BIOS testing, the IC's functional input and output pins are converted into multiple pairs of TDI inputs and TDO outputs to supply an input and an output to each DREG in the IC. Also the instruction outputs control to enable each BIOS1-n and DREG1-n to autonomously regulate testing of an associated circuit. During the parallel BIOS test mode, the IC is coupled to a tester, as shown in FIG. 15. The tester inputs instructions, data and control via the 4-wire test bus (TMS, TCK,TDI,TDO) and outputs data via multiple TDOs to the IC (TDI1-n) and receives data via multiple TDIs from the IC (TDO1-n).

If the DREGs are coupled to combinational circuits, the individual tests can be performed as described in connection with FIG. 12. During test the tester outputs control on the TMS and TCK outputs to be input to the IC's TMS and TCK control inputs. In addition, the tester outputs serial data on its TDO1-n outputs to be input to the IC's TDI1-n input pins, and receives serial data on it's TDI1-n inputs from the IC's TDO1-n output pins.

In response to a control input from the tester, the IC's TAP outputs control to all the BIOS circuits (BIOS1-n) to start testing. During parallel BIOS testing the TAP remains in the SHIFTDR state for inputting and outputting data to and from the DREGs via the TDI1-n inputs and TDO1-n outputs. While the TAP is in the SHIFTDR state, each BIOS autonomously regulates the shifting in and updating of input test patterns to a related circuit under test and the capturing and shifting out of output test patterns from a related circuit under test, via a DREG's DISR and DOSR sections. The testing of each individual combinational circuit can be identical to that described in connection with the single IC environment of FIG. 12. In this case, however, multiple DREGs are being accessed by multiple BIOS circuits to test multiple combinational circuits concurrently.

The test time for the parallel BIOS test mode is equal to the time it takes to test the circuit with the longest test pattern application sequence. For example, if the IC has 100 combinational circuits being tested in parallel, and each has a DREG consisting of a DISR length of 16 bits, the test time to test all 100 circuits in parallel with a TCK frequency of 10 Mhz can be calculated using equations 11 and 12 as applied in connection with FIG. 12 above.

# of $TCKs$ in the SHIFTDR state=$I \times 2^I$     Eq11

Where:

I=the # of DISR bits

Parallel BIOS Test Time=(Eq11)×(1/$TCKfreg$)     Eq12

Parallel BIOS Test Time=(16×$2^{16}$)×(1/10 Mhz)=104.9 ms     Eq12

If the DREGs are coupled to sequential circuits, the individual tests can be performed as described in connection with FIG. 13. During test the tester outputs control on the TMS and TCK outputs to be input to the IC's TMS and TCK control inputs. In addition, the tester outputs serial data on its TDO1-n outputs to be input the IC's TDI1-n input pins, and receives serial data on it's TDI1-n inputs from the IC's TDO1-n output pins.

In response to the control input from the tester, the IC's TAP outputs control to all the BIOS circuits (BIOS1-n) to start testing. During parallel BIOS testing the TAP remains in the SHIFTDR state for inputting and outputting data to and from the DREGs via the TDI1-n inputs and TDO1-n outputs. While the TAP is in the SHIFTDR state, each BIOS autonomously regulates the shifting in and updating of input test patterns to a related circuit under test, the sequential control required to cause the circuit to react to the input patterns and produce output response test patterns, and the capturing and shifting out of the response test patterns from a related circuit under test, via a DREG's DISR and DOSR sections. The testing of each individual sequential circuit can be identical to that described in connection with the single IC environment of FIG. 13. In this case, however, multiple DREGs are being accessed by multiple BIOS circuits to test multiple sequential circuits concurrently.

The test time for the parallel BIOS test mode is equal to the time it takes to test the circuit with the longest test pattern application sequence. For example, if the IC has 100 sequential circuits being tested in parallel, and each has a DREG consisting of a DISR length of 16 bits, the test time to test all 100 circuits in parallel with a TCK frequency of 10 Mhz can be calculated using equations 11 and 12 as applied in connection with FIG. 13 above.

# of $TCKs$ in the SHIFTDR state=$I \times 2^I$     Eq11

Where:

I=the # of DISR bits

Parallel BIOS Test Time=(Eq11)×(1/$TCKfreg$)     Eq12

Parallel BIOS Test Time=(16×$2^{16}$)×(1/10 Mhz)=104.9 ms     Eq12

Since the parallel BIOS architecture includes a BIOS for each DREG and associated circuit being tested in parallel, it does not require the test patterns to be framed as described in connection with FIG. 16. Thus the tester does not have to modify the test patterns to each circuit by inserting dummy bit positions to balance out serial test patterns to DREGs of different lengths.

During parallel BIOS testing as shown in FIG. 17, each BIOS autonomously regulates the starting and stopping of a test operation on an associated circuit independent of the 1149.1 TAP. Once a BIOS starts a test operation, as described above, it inputs test data to and outputs test data from a circuit under test only for the length of time required to complete the test. At the end of each test operation, as described above, the BIOS terminates the test input and output operations to and from the circuit.

In very large scale integrated (VLSI) circuits with potentially hundreds of circuits being tested in parallel, especially RAM memory circuits, the power consumed by the IC can be a problem. The heat generated from concurrently testing multiple internal circuits can degrade or in some cases even destroy an IC. The ability of each BIOS, in a parallel BIOS architecture, to apply the test only for the required amount of time to test the circuit, decreases the risk of destroying an IC due to heat related problems brought about by having to operate all the circuits simultaneously for an extended period of time.

In addition, each BIOS circuit can be programmed to start its test operation after a predetermined count value has expired (startcnt of FIG. 9). Using this approach, each BIOS in a parallel BIOS architecture can be programmed to start its test operation at a predetermined time. This allows the testing of multiple circuits within an IC to be staggered to where as one BIOS test operation completes, another BIOS test operation begins. The benefit of staggering the test operations of internal circuits in an IC is that it reduces the number of circuits being actively tested at any one point in time, which results in less heat generated during the test, which in turn reduces the risk of damaging or destroying the IC.

As described above, the DOSR can be made to operate as a parallel signature analysis register instead of a parallel input/serial output register. The advantages of operating the DOSR in a parallel signature analysis mode were described in connection with FIG. 10d. Operating the DOSR in the parallel signature analysis mode in the parallel BIOS architecture offers an additional advantage.

When the DOSRs of the DREGs in a parallel BIOS architecture are placed in their parallel signature analysis mode, the requirement of having to multiplex the ICs functional pins into multiple TDO test pins is no longer necessary. The TDO test pins are not required when the DOSRs operate in their parallel signature analysis mode because test data is not shifted out of the DOSR during parallel signature analysis testing. This reduces the reconfiguration of the IC's function pins to where they only need to operate as TDI inputs to the DREGs of the circuits being tested.

The advantage then is that in a pin limited IC, more internal circuits can be tested in parallel since more of the functional pins are available to be used as TDI input pins. For example, in an IC with 100 functional pins (excluding power, ground, and test bus pins), 100 TDI input pins can be used to test 100 internal circuits in parallel. For the same IC, in the non-parallel signature analysis test mode, only 50 internal circuits could be tested in parallel since each circuit would require that two functional pins be used to operate as a TDI input and a TDO output during the test.

Figure 18:
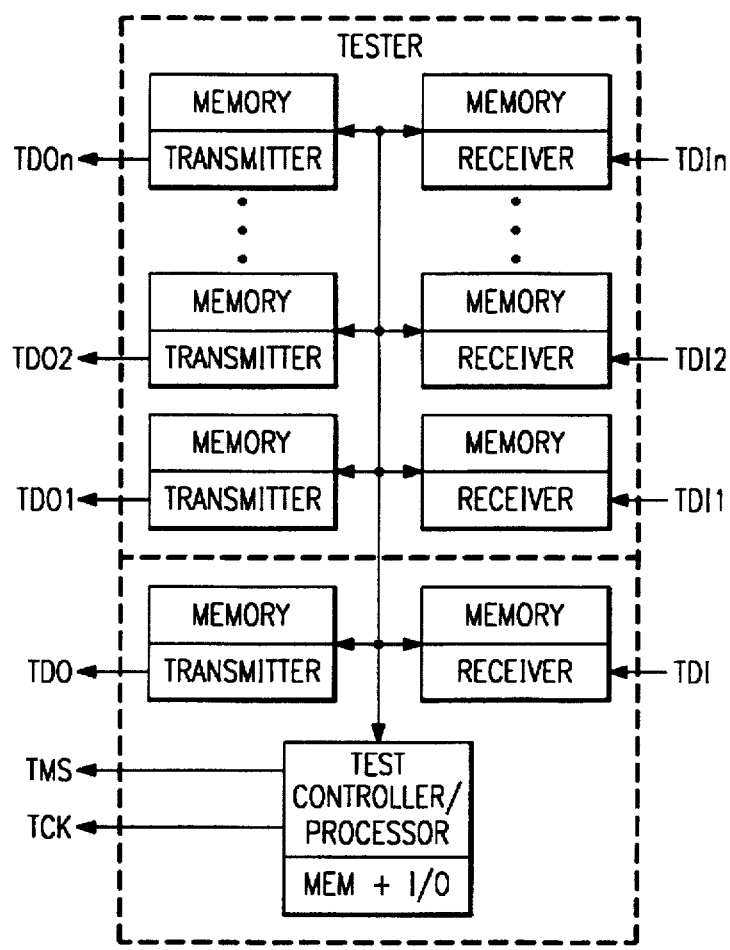

In FIG. 18, the test bus controller or tester of FIG. 15 is shown in more detail with multiple TDI and TDO test channels and associated circuitry. The portion below the dotted line includes the primary TDI and TDO channels and associated transmitter/memory, receiver/memory circuitry, and TMS and TCK control channels and associated test controller/processor and memory & I/O circuitry. The test controller/processor controls the test operation, the associated memory stores test patterns and test programs, and the associated I/O allows the tester to communicate to external peripheral devices like terminals, printers, keyboards, diskdrives and communication networks. The tester includes additional TDI and TDO test channels and associated transmitter/memory and receiver/memory circuits. Control from the test controller/processor is routed to the primary TDI and TDO channels and also to the added TDO and TDI channels to regulate the test operation.

It should be evident from the foregoing that the present invention can be used in conjunction with any serial scan based test architecture to test any type of electrical circuit, whether analog, digital, or mixed signal, provided the circuit has an input and output boundary structure that is scanable via a serial test bus. Examples of this concept are set forth below.

Figure 24:
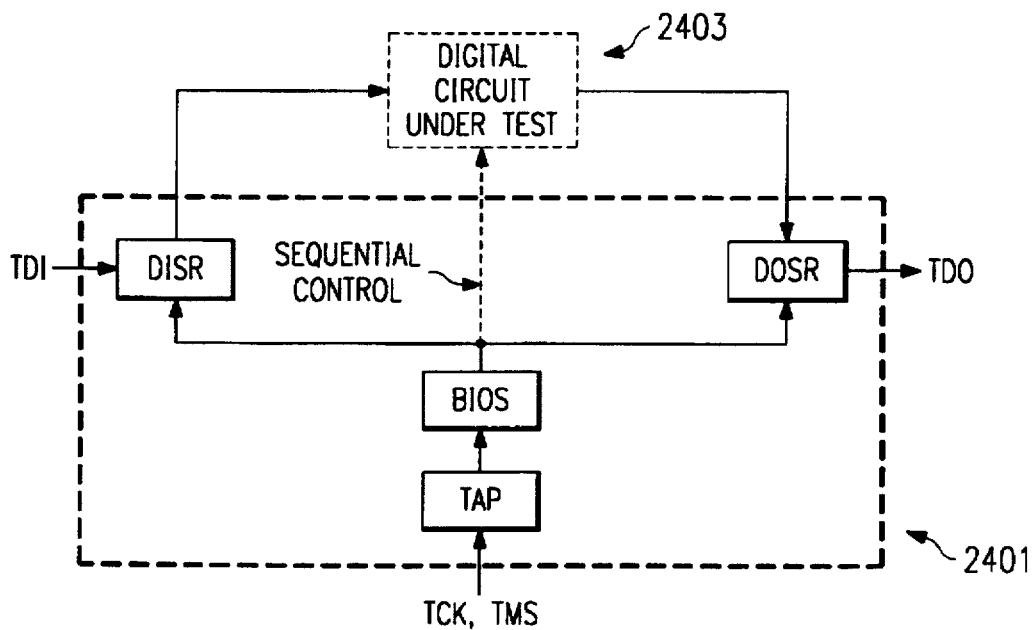
FIGS. 24–28 illustrate exemplary test environments according to the present invention.

In FIG. 24, the TAP, BIOS, DISR, and DOSR are provided on a first circuit 2401. A second circuit 2403 (a digital circuit) receives input data from the DISR of the first circuit 2401 and outputs data to the DOSR of the first circuit. If the second circuit 2403 is sequential, it also receives control input from the BIOS of the first circuit 2401, as shown by the dotted line from the BIOS to the second circuit. The testing of the second circuit 2403, whether it be combinational or sequential, occurs as previously described herein. The first and second circuits 2401 and 2403 can be provided physically separate from one another. As examples, the first and second circuits 2401 and 2403 could be respectively provided on different ICs, one or both of the first and second circuits could include multiple ICs, or one or both of the first and second circuits could include multiple circuit boards which each include multiple ICs.

Figure 25:
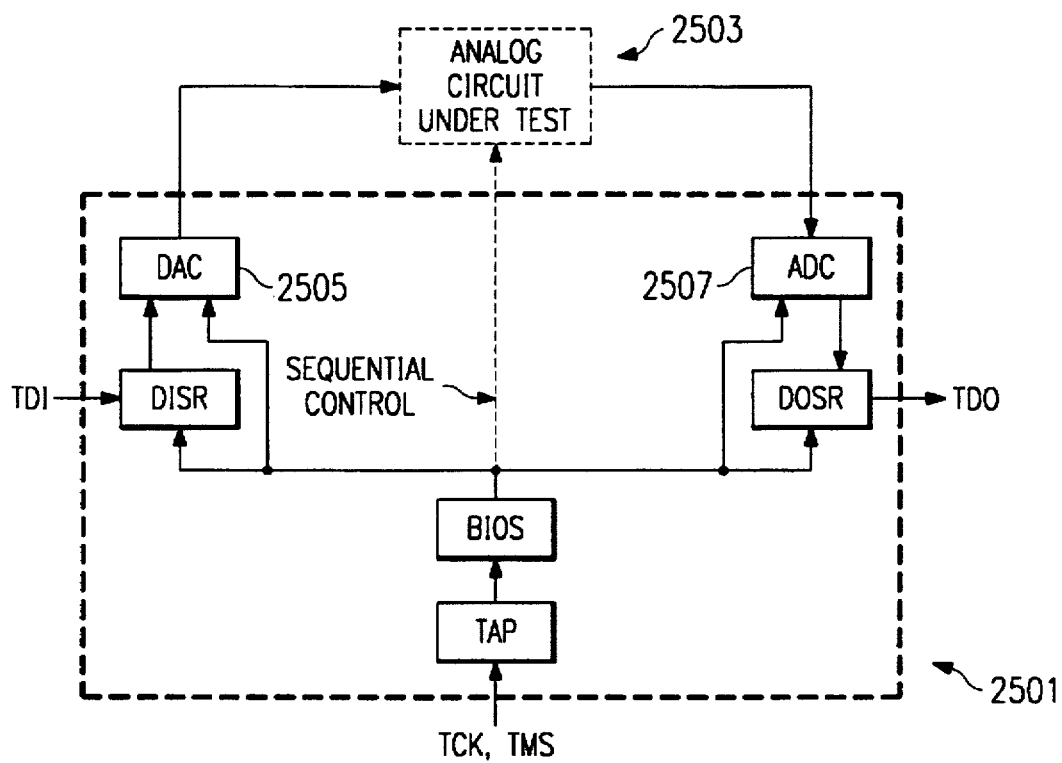

In FIG. 25, the TAP, BIOS, DISR, and DOSR are provided on a first circuit 2501. A second circuit 2503 (an analog circuit) receives input data from the DISR of the first circuit 2501 via a digital to analog converter (DAC) 2505, and outputs data to the DOSR of the first circuit via an analog to digital convertor (ADC) 2507. The DAC 2505 and the ADC 2507 receive control input from the BIOS, as shown in FIG. 25. If the second circuit 2503 is sequential, it also receives control input from the BIOS of the first circuit 2501, as shown by the dotted line from the BIOS to the second circuit. After the DISR has performed the Shift DISR and Update DISR operations as described above, the BIOS outputs control as needed to cause the DAC 2505 to convert the digital data from the DISR into an analog signal which is input to the circuit 2503. The circuit 2503 then responds to the analog input by outputting an analog signal to the ADC 2507. If circuit 2503 is a sequential circuit, then the BIOS must output appropriate control to permit circuit 2503 to respond to the analog input. Once the analog output from circuit 2503 has been applied to ADC 2507, the BIOS outputs control as needed to cause the ADC 2507 to convert the analog output from circuit 2503 into a digital signal which is thereafter captured by the DOSR. The BIOS will implement wait states (described above) as necessary to allow sufficient time for applying control to the DAC 2505, the circuit 2503 (if sequential) and the ADC 2507 between the Update DISR operation and the Capture DOSR operation.

The testing of the second circuit 2503, whether it be combinational or sequential, occurs as previously described herein. The first and second circuits 2501 and 2503 can be provided physically separate from one another. As examples, the first and second circuits 2501 and 2503 could be respectively provided on different discrete electrical devices, one or both of the first and second circuits could include multiple discrete devices, or one or both of the first and second circuits could include multiple circuit boards which each include multiple discrete devices. While the DAC 2505 and ADC 2507 are shown on the first circuit 2501, one or both could be on the second circuit 2503 or at some other location instead.

Some DACs include input registers that can take the place of the Update Register (see FIG. 12) of the DISR. When using such a DAC, the gate count of the DISR can be reduced because the DISR need only be a shift register instead of a shift register combined with an update output register. The input register of the DAC can receive the Update control output from the BIOS, causing data from the DISR to be loaded into the input register of the DAC.

Figure 26:
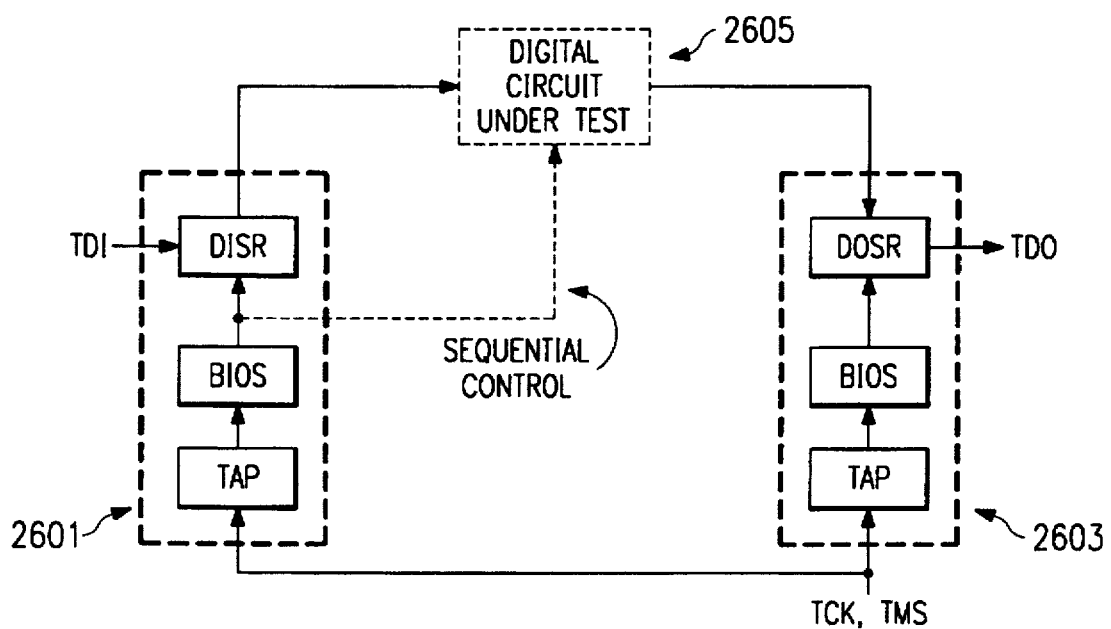

In FIG. 26, a TAP, BIOS and DISR are provided on a first circuit 2601, and a TAP, BIOS, and DOSR are provided on a second circuit 2603. A third circuit 2605 (a digital circuit) receives input data from the DISR of the first circuit 2601 and outputs data to the DOSR of the second circuit 2603. If the third circuit 2605 is sequential, it also receives control input from the BIOS of the first or second circuit. In this example, the sequential control input to the third circuit 2605 comes from the BIOS of the first circuit 2601 via the dotted line connection. The testing of the third circuit 2605, whether it be combinational or sequential, occurs as previously described herein. FIG. 26 is thus similar to FIG. 24 except that the function of the circuit 2401 in FIG. 24 is performed in FIG. 26 by two circuits, 2601 and 2603, which are provided physically separate from one another. The timing during test is synchronized by the common TCK and TMS inputs to the TAPs of the circuits 2601 and 2603.

Figure 27:
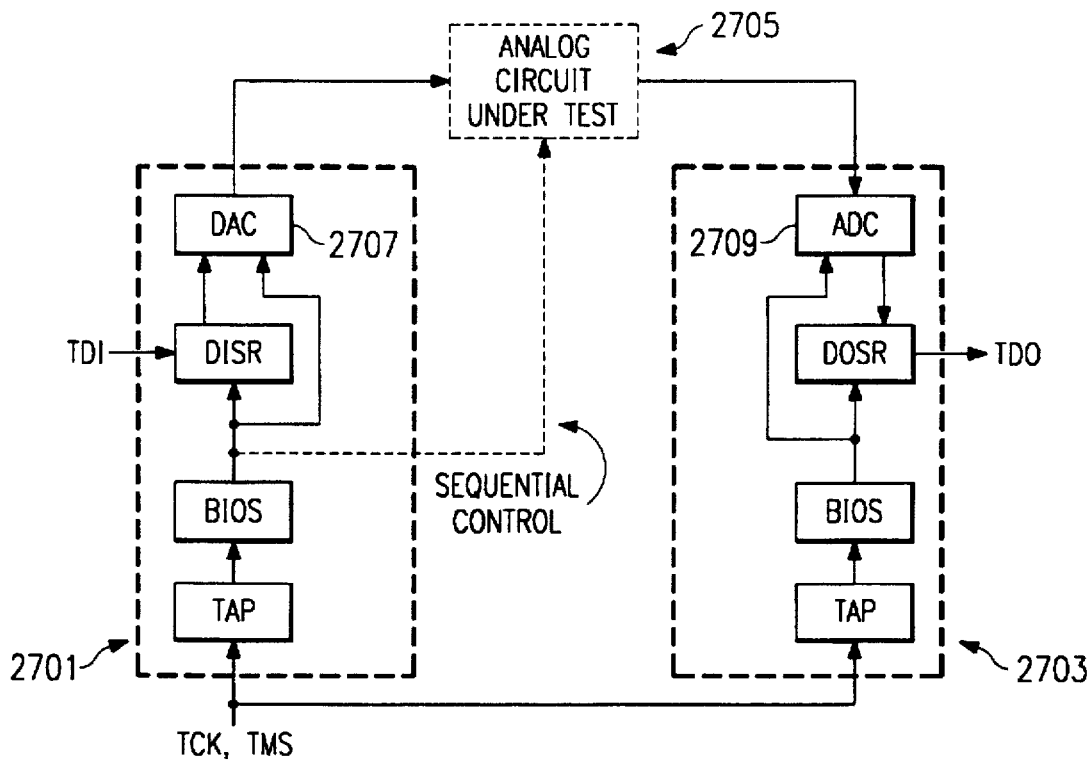

In FIG. 27, a TAP, BIOS and DISR are provided on a first circuit 2701, and a TAP, BIOS, and DOSR are provided on a second circuit 2703. A third circuit 2705 (an analog circuit) receives input data from the DISR of the first circuit 2701 via a DAC 2707, and outputs data to the DOSR of the second circuit 2703 via an ADC 2709. The DAC 2707 receives control input from the BIOS of the first circuit 2701, and the ADC 2709 receives control input from the BIOS of the second circuit 2703, as shown in FIG. 27. If the third circuit 2705 is sequential, it also receives control input from the BIOS of the first or second circuit. In this example, the sequential control input to the third circuit 2705 comes from the BIOS of the first circuit 2701 via the dotted line connection. The testing of the third circuit 2703, whether it be combinational or sequential, occurs as previously described herein. FIG. 27 is thus similar to FIG. 25 except that the function of the circuit 2501 in FIG. 25 is performed in FIG. 27 by two circuits, 2701 and 2703, which are provided physically separate from one another. The timing during test is synchronized by the common TCK and TMS inputs to the TAPs of the circuits 2701 and 2703. While the DAC 2707 and ADC 2709 are respectively provided on the first and second circuits 2701 and 2703, one or both could be provided on the third circuit 2705 or in some other location instead.

Figure 28:
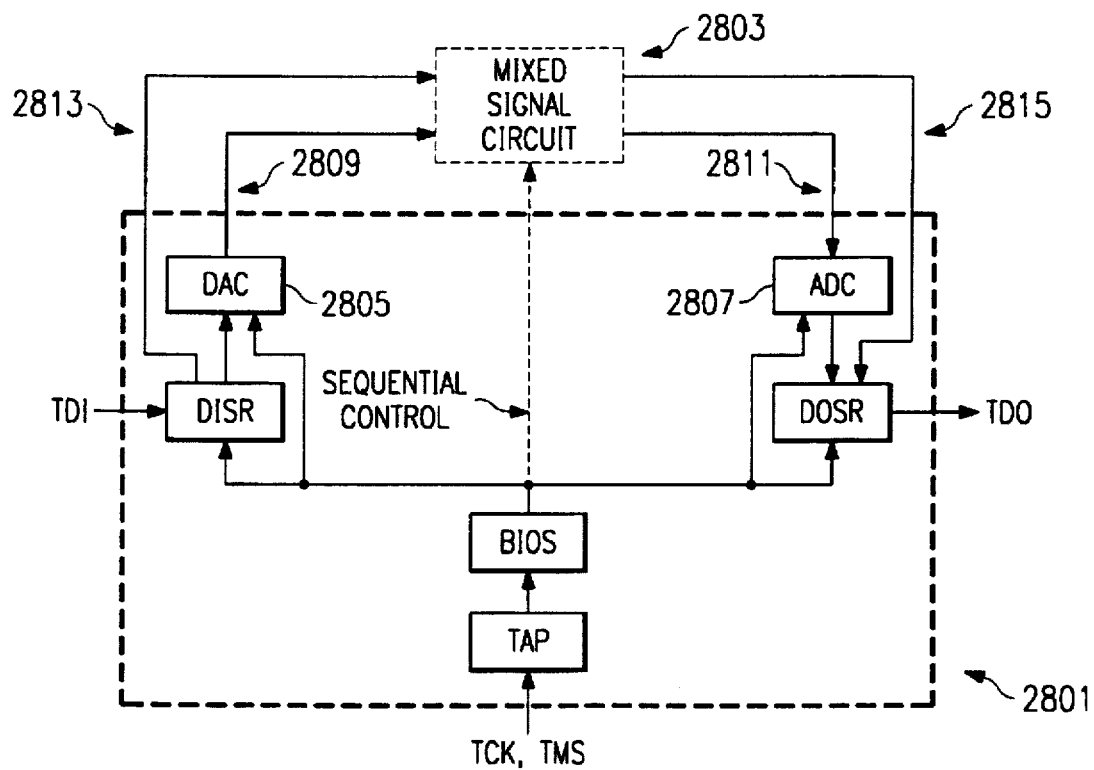

FIG. 28 is similar to FIGS. 24 and 25, but the circuit under test is a mixed signal circuit 2803 having analog and digital inputs, and analog and digital outputs. The analog inputs 2809 to mixed signal circuit 2803 are provided by DAC 2805 as in FIG. 25 above, and the analog outputs 2811 from mixed signal circuit 2803 are applied to ADC 2807, also as in FIG. 25. The digital inputs 2813 to mixed signal circuit 2803 are provided directly from the DISR of circuit 2801 as in FIG. 24 above, and the digital outputs 2815 from mixed signal circuit 2803 are applied directly to the DOSR of circuit 2801, also as in FIG. 24. If mixed signal circuit 2803 is sequential, it also receives control input from the BIOS of circuit 2801, as shown by the dotted line from the BIOS to mixed signal circuit 2803. The testing of the mixed signal circuit, whether it be combinational or sequential, occurs as previously described herein.

Figure 29:
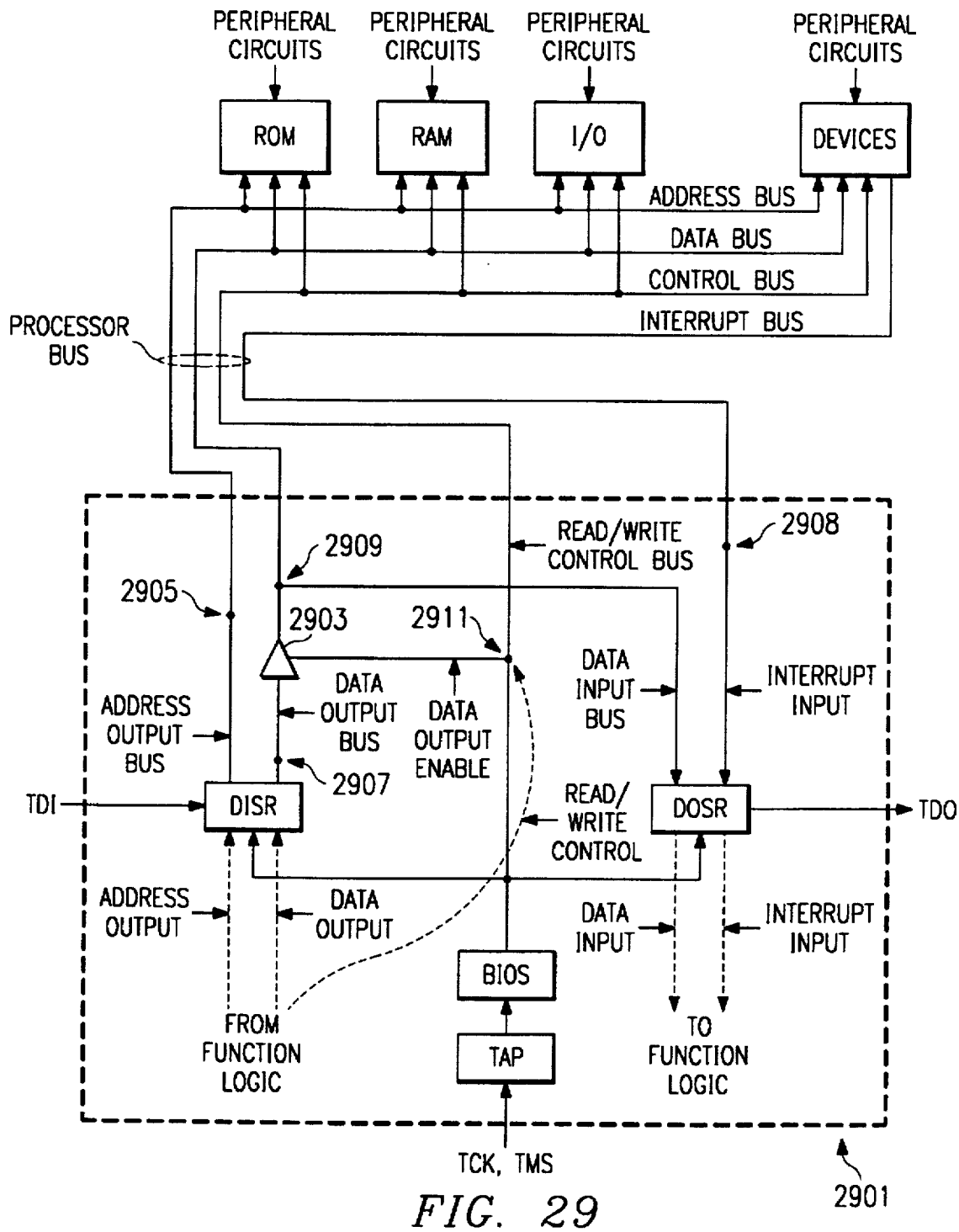
FIG. 29 is a block diagram illustrating an exemplary test and emulation application of the present invention.

FIG. 29 shows one way that the TAP, BIOS, DISR, and DOSR can be used in a data processor 2901. The DISR is coupled to access the data processor's address output bus and data output bus, and the DOSR is coupled to access the data processor's data input bus and interrupt bus. The data processor 2901 can be, for example, a conventional microprocessor modified to include the TAP, BIOS, DISR and DOSR. When placed in test mode, the TAP, BIOS, DISR, and DOSR provide a fast and efficient way not only to test peripheral circuits associated with the processor's I/O boundary, but also to emulate the functional behavior of the processor using the serial test bus for input and output. Emulation of the processor's normal I/O and interrupt operation is useful in debugging hardware and software problems, and in software development.

During normal operation of the data processor 2901, the DISR and DOSR are disabled and transparent, allowing the processor's functional logic circuitry to perform I/O and interrupt operations on external peripheral circuits (such as the illustrated ROM, RAM, I/O and other devices) via the address, data, control and interrupt buses. As shown in FIG. 29, addresses and output data can be routed from the processor's functional logic circuitry through the transparent DISR to the peripheral circuits, and input data and interrupts can be routed from the peripheral circuits through the transparent DOSR to the functional logic circuitry. The transparent DISR and DOSR enable the processor's functional logic to directly execute I/O and interrupt operations relative to the peripheral circuits. This is accomplished via the bus connections (shown in dotted lines) between the DISR and DOSR and the functional logic of the processor. The DISR and DOSR circuits have multiplexed outputs that permit the peripheral circuits to be selectively coupled to either the processor's functional logic or the shift registers inside the DISR and DOSR circuits. Also during normal operation, the data output enable and read/write control functions are controlled by the processor's functional logic, as illustrated by the dotted line connection of the functional logic to the control bus at 2911 in FIG. 29.

During testing or emulation, the processor's normal I/O and interrupt operations are disabled and the DISR and DOSR are enabled to perform, via the multiplexed outputs of the DISR and DOSR circuits, either testing of the peripheral devices or emulation of the processor's I/O and interrupt operations. During testing operation, the TAP, BIOS, DISR and DOSR cooperate as previously described herein to cause the DISR to output test patterns to the peripheral circuits, and to permit the DOSR to receive the response of the peripheral circuits. During emulation operation, the TAP, BIOS, DISR and DOSR cooperate as previously described herein to cause the DISR to output addresses and data to the peripheral circuits, and to permit the DOSR to receive data and interrupts from the peripheral circuits.

The peripheral circuits of FIG. 29 are sequential circuits in that they require control inputs to enable them to input data from the processor or output data to the processor. During testing or emulation, the function logic control at 2911 is disabled, and the BIOS is enabled to perform this control. For example, the BIOS can output read/write control just as would normally be output by the processor. Switching between the functional logic circuitry and the BIOS as the source of control input has been described above in connection with FIGS. 22–23. The control input from the BIOS enables the peripheral circuits to, for example, accept data from the DISR into an addressed location, and to output data to the DOSR from an addressed location. In addition, the BIOS outputs control (data output enable) to 3-state buffers 2903 on the data output bus to regulate when data is being written to or read from the peripheral circuits. When data is being written to the peripheral circuits, the 3-state buffers 2903 are enabled to allow data from the DISR to be output to the peripheral circuits. When data is being read from the peripheral circuits, the 3-state buffers 2903 are disabled to allow data from the peripheral circuits to be input to the DOSR.

Because the BIOS provides the necessary control signals in FIG. 29, the present invention provides faster processor I/O emulation and peripheral circuit testing than can be achieved using multiple data register scan operations, for the reasons discussed above.

In FIG. 29, the actual functional logic circuitry of the data processor is not necessary to exercise system I/O and interrupt operations. Thus, using the emulation capability of the present invention, the system architecture can be designed and verified in parallel with the data processor design, or even before the data processor design is available. Further, the emulation is performed via a serial bus having a relatively small number of wires, which simplifies the emulation cabling and wiring interconnect, particularly as compared to conventional plug-in emulation devices which require cabling all the processor pins to the emulation controller. The approach disclosed herein requires cabling only the serial bus to the emulation controller.

Although FIG. 29 shows one exemplary embodiment wherein either the function logic or the emulation logic selectively executes the I/O and interrupt operations, it will be apparent that other techniques can be implemented to permit switching between the function logic and the emulation logic. For example, rather than utilizing the aforementioned multiplexed outputs in the DISR and DOSR circuits, the functional logic circuitry could simply be connected to the address bus at 2905, to the data output bus at 2907, to the interrupt input bus at 2908, and to the data input bus at 2909. Such an arrangement would permit switching between the functional logic and the emulation logic.

Although FIG. 29 shows a data processor and external peripheral circuits that might appear, for example, on a board design, the present invention is independent of the actual physical implementation of the FIG. 29 system. As other examples, the system of FIG. 29 could be provided in a single IC, a plurality of systems similar to the one shown in FIG. 29 could be provided in a single IC or on some other common substrate such as a multi-chip module or board, or one or more systems similar to the FIG. 29 system could be provided on a plurality of multi-chip modules or boards.

Although exemplary embodiments of the present invention are described above, this does not limit the scope of the invention, which can be practiced in a variety of embodiments.

What is claimed is:

1. An emulator for emulating operations of data processing circuitry normally connected to and cooperable with a peripheral circuit, comprising:

serial scanning circuitry connectable to the peripheral circuit in substitution for the data processing circuitry and, when connected to the peripheral circuit, providing to and receiving from the peripheral circuit signals which would normally be provided and received by the data processing circuitry during normal cooperation between the data processing circuitry and the peripheral circuit when the data processing circuitry is connected to the peripheral circuit, said serial scanning circuitry being connectable to an emulation controller for permitting serial data transfer between the emulation controller and the emulator; and control circuitry connected to said serial scanning circuitry and connectable to the emulation controller for, when connected to the emulation controller, permitting said serial scanning circuitry to provide and receive said signals while serial data is being transferred in a continuous serial data stream between the emulation controller and said serial scanning circuitry.

2. The emulator of claim 1, wherein said serial scanning circuitry includes a shift register which is also operable to perform parallel data transfer.

3. The emulator of claim 2, wherein said control circuitry is operable to apply to said shift register a control signal which controls said shift register for serial shifting of data and for parallel data transfer.

4. The emulator of claim 3, wherein said signals are provided and received via said parallel data transfer operation of said shift register.

5. The emulator of claim 4, wherein said control circuitry is programmable from the emulation controller to control operation of said shift register via said control signal.

6. A data processing apparatus, comprising:

data processing circuitry for performing data processing operations on data;

an input/output bus which is coupled to and normally controlled by said data processing circuitry and is connectable to a peripheral circuit for permitting communication between said data processing circuitry and said peripheral circuit; and emulation circuitry coupled to said input/output bus for selectively taking control of said input/output bus in substitution for said data processing circuitry and emulating on said input/output bus operations normally performed on said input/output bus by said data processing circuitry when said data processing circuitry controls said input/output bus, said emulation circuitry including serial scanning circuitry for providing to and receiving from said input/output bus signals which are normally provided to and received from said input/output bus by said data processing circuitry when said data processing circuitry controls said input/output bus, said serial scanning circuitry being connectable to an emulation controller for permitting serial data transfer between the emulation controller and said data processing apparatus, and said emulation circuitry including control circuitry connected to said serial scanning circuitry and connectable to the emulation controller for, when connected to the emulation controller, permitting said serial scanning circuitry to provide and receive said signals while serial data is being transferred in a continuous serial data stream between the emulation controller and said serial scanning circuitry.

7. The apparatus of claim 6, wherein said serial scanning circuitry includes a shift register which is also operable to the perform parallel data transfer.

8. The apparatus of claim 7, wherein said control circuitry is operable to apply to said shift register a control signal which controls said shift register for serial shifting of data and for parallel data transfer.

9. The apparatus of claim 8, wherein said signals are provided and received via said parallel data transfer operation of said shift register.

10. The apparatus of claim 9, wherein said control circuitry is programmable from the emulation controller to control operation of said shift register via said control signal.

11. A data processing system, comprising:

a data processing apparatus including data processing circuitry for performing data processing operations on data, and an input/output bus coupled to and normally controlled by said data processing circuitry for transferring information into and out of said data processing apparatus;

a peripheral circuit connected to said input/output bus for communication with said data processing apparatus; and said data processing apparatus including additional circuitry coupled to said input/output bus for selectively taking control of said input/output bus in substitution for said data processing circuitry and performing one of (1) a test operation wherein said peripheral circuit is tested using said input/output bus and said additional circuitry and (2) an emulation operation wherein said additional circuitry emulates on said input/output bus operations normally performed on said input/output bus by said data processing circuitry when said data processing circuitry controls said input/output bus, said additional circuitry including serial scanning circuitry coupled to said input/output bus for supporting one of said test operation and said emulation operation, said serial scanning circuitry being connectable to an external controller for permitting serial data transfer between the external controller and said data processing system, and said additional circuitry including control circuitry connected to said serial scanning circuitry and connectable to the external controller for, when connected to the external controller, permitting one of test signals for testing said peripheral circuit and emulation signals for emulating operations of said data processing circuitry to be transferred between said serial scanning circuitry and said input/output bus while serial data is being transferred in a continuous serial data stream between the external controller and said serial scanning circuitry.

12. The system of claim 11, wherein said serial scanning circuitry includes a shift register which is operable to perform parallel data transfer.

13. The system of claim 12, wherein said control circuitry is operable to apply to said shift register a control signal which controls said shift register for serial shifting of data and for parallel data transfer.

14. The system of claim 13, wherein one of said test signals and said emulation signals are transferred via said parallel data transfer operation of said shift register.

15. The system of claim 14, wherein said control circuitry is programmable from the external controller to control operation of said shift register via said control signal.

16. The system of claim 11, wherein said peripheral circuit includes sequential circuitry, and wherein said control circuitry is operable to provide said sequential circuitry with a control signal necessary for normal operation of said sequential circuitry.

17. The system of claim 16, wherein said control circuitry is operable to apply said control signal to said sequential circuitry independently of said serial scanning circuitry.

18. The system of claim 16, wherein said control circuitry is programmable from the external controller to control operation of said sequential circuitry via said control signal.

19. The system of claim 11, wherein said peripheral circuit includes one of a read only memory circuit and a read/write memory circuit.

20. A method of emulating operations of data processing circuitry normally connected to and cooperable with a peripheral circuit, comprising the steps of:

connecting the peripheral circuit to serial scanning circuitry in substitution for the data processing circuitry; and providing to and receiving from the peripheral circuit signals normally provided to and received from the peripheral circuit by the data processing circuitry when the data processing circuitry is connected to the peripheral circuit, said providing and receiving step including the step of using the serial scanning circuitry to provide and receive the signals while serial data is being transferred in a continuous serial data stream through the serial scanning circuitry.

\* \* \* \* \*